(12) United States Patent
Rao

(10) Patent No.: US 7,124,042 B2
(45) Date of Patent: Oct. 17, 2006

(54) ESTIMATING A PLURALITY OF TONES IN AN INPUT SIGNAL

(75) Inventor: Yong Rao, Round Rock, TX (US)

(73) Assignee: National Instruments Corporation, Austin, TX (US)

(*) Notice: Subject to any disclaimer, the term of this patent is extended or adjusted under 35 U.S.C. 154(b) by 191 days.

(21) Appl. No.: 10/757,835

(22) Filed: Jan. 15, 2004

(65) Prior Publication Data

US 2004/0148116 A1    Jul. 29, 2004

Related U.S. Application Data

(60) Division of application No. 10/037,620, filed on Jan. 3, 2002, now Pat. No. 6,721,673, which is a continuation-in-part of application No. 09/880,167, filed on Jun. 12, 2001, now Pat. No. 6,775,629.

(51) Int. Cl.
   *G06F 19/00* (2006.01)
(52) U.S. Cl. .......................................... 702/76; 73/1.82
(58) Field of Classification Search .................. 702/76, 702/182, 69; 73/1.82, 570, 579; 324/674, 324/601, 603, 707
   See application file for complete search history.

(56) References Cited

U.S. PATENT DOCUMENTS

| | | | | |
|---|---|---|---|---|
| 4,698,769 A | 10/1987 | McPherson et al. | ........ | 708/312 |
| 5,930,308 A * | 7/1999 | Schmutz | ...................... | 375/340 |
| 6,122,657 A | 9/2000 | Hoffman, Jr. et al. | ...... | 709/201 |
| 6,128,370 A | 10/2000 | Barazesh et al. | ............. | 329/31 |
| 6,195,675 B1 | 2/2001 | Wang et al. | ............... | 708/405 |
| 6,229,889 B1 | 5/2001 | Cannon et al. | ............. | 379/386 |

\* cited by examiner

*Primary Examiner*—Edward Raymond
(74) *Attorney, Agent, or Firm*—Meyertons Hood Kivlin Kowert & Goetzel, P.C.; Jeffrey C. Hood; Mark S. Williams

(57) ABSTRACT

A system and method for estimating parameters of multiple tones in an input signal. The method includes receiving samples of the input signal, generating a frequency transform (FT) of the samples, identifying multiple amplitude peaks in the FT corresponding to the tones, and determining parameter estimates characterizing each of the multiple tones based on the peaks. For each tone, the effects of the other tones are removed from the FT of the peak of the tone using the parameter estimates of the other tones to generate modified FT data for the tone. Single tone estimation is applied to the modified FT data to generating refined parameter estimates of the tone, which is used to update the parameter estimates of the tone. After refining the estimates for each tone, the entire process may be repeated one or more times using successive refined estimates to generate final estimates for the parameters.

87 Claims, 28 Drawing Sheets

ESTIMATING A PLURALITY OF TONES IN AN INPUT SIGNAL

PRIORITY DATA

This application is a divisional application of U.S. patent application Ser. No. 10/037,620, titled "Estimating A Plurality of Tones in an Input Signal" filed Jan. 3, 2002 now U.S. Pat. No. 6,721,673, whose inventor is Yong Rao, which is a continuation-in-part of U.S. patent application Ser. No. 09/880,167 titled "System and Method for Estimating One or More Tones in an Input Signal" filed Jun. 12, 2001 now U.S. Pat. No. 6,775,629, whose inventors are Yong Rao and Michael Cerna.

FIELD OF THE INVENTION

The invention relates generally to the field of signal analysis, and more particularly, to detecting the frequency, amplitude and/or phase of a plurality of tones comprised within an input signal.

DESCRIPTION OF THE RELATED ART

In many applications, it is necessary or desirable to precisely locate multiple tones comprised in a signal. This need arises in many fields including telecommunications, radar, sonar, networking, measurement, and various other applications. Prior art techniques for detecting tones in a signal generally may not produce accurate results and/or may suffer from slow performance.

The discrete Fourier transform (DFT) is a popular tool for analyzing signals. However, before an input signal is transformed, it is quite often windowed with a windowing function. (It is noted that the action of capturing a finite-length sequence of samples of the input signal automatically implies a rectangular windowing.) The frequency transform F(n) of the windowed input signal will typically exhibit multiple scaled and shifted versions of transform function W, i.e., the transform of the window function. Each sinusoidal component of the input signal expresses itself as a pair of such shifted versions, one version shifted up to the frequency $f_j$ of the sinusoidal component, and the other shifted down to frequency $-f_j$. The positive frequency version is referred to herein as a positive frequency image, and the negative frequency version is referred to herein as a negative frequency image. When a sinusoidal component frequency $f_j$ is small compared to the sample rate, the positive frequency image and the negative frequency image for the sinusoidal component may overlap in frequency space. Similarly, when a sinusoidal component frequency $f_j$ is close to one-half the sample rate, the positive frequency image and the negative frequency image for the sinusoidal component may overlap. Furthermore, when two sinusoidal components have frequencies that are close together, their positive images and negative images may overlap.

Prior art techniques for tone estimation quite often focus on identifying the peaks in the magnitude spectrum |F(n)|. The peaks roughly determine the frequency of the corresponding tones. However, because of the cross-interaction of the images from other tones, or the negative frequency image from the same tone, the peak of a positive frequency image may be perturbed away from a purely scaled and frequency-shifted version of the template function W. Thus, parameter estimation techniques which compute parameters for a given tone based only on transform array values (i.e. DFT values) in the vicinity of a corresponding image peak may not produce accurate results. Therefore, there exists a substantial need for a system and method which can estimate tone parameters from the transform array for a plurality of tones with increased accuracy.

SUMMARY OF THE INVENTION

The present invention comprises various embodiments of a system and a method for estimating signal parameters (e.g., one or more of frequency, amplitude and/or phase) of a plurality of tones present in an input signal. More particularly, a system and method are described for estimating parameters for each of a plurality of tones based on a frequency transform F(n) of the input signal, where the input signal may be windowed with a window function w(n) and transformed into the frequency domain.

In one embodiment, the method may include first receiving the input signal. For example, samples of the input signal may be received, where the samples include the plurality of tones.

One or more signal parameter estimates characterizing each of the plurality of tones may be determined based on the received samples. In one embodiment, the one or more signal parameter estimates characterizing each of the plurality of tones may comprise a knowledge base of the signal parameter estimates, and the method may further include storing a copy of the knowledge base, as a prior knowledge base.

Then, the method may generate a refined estimate of the one or more signal parameters of each respective tone of the plurality of tones, updating the one or more signal parameter estimates accordingly, where the refined estimates are generated in an iterative fashion. In other words, refined estimates of the parameters for each tone may be generated in an iterative fashion, where each successive iteration produces a more refined estimate of parameters for each tone. Updating the one or more signal parameter estimates with the refined estimate of the one or more signal parameters of the respective tone may include updating the knowledge base with the refined estimate of the one or more signal parameters of the tone, where, after updating the estimates for each tone, the knowledge base is comprised of the refined estimates for each tone.

In one embodiment, iteratively generating the refined estimate of the signal parameters of each of the respective tones may include: for each respective tone of the plurality of tones, generating a refined estimate of the one or more signal parameters of the respective tone, and updating the one or more signal parameter estimates (e.g., the knowledge base) with the refined estimate. The generating and updating for each respective tone may be performed one or more times to produce final one or more signal parameter estimates for each of the plurality of tones. In one embodiment, performing the generating and updating one or more times may include performing the generating and updating for each respective tone in an iterative manner until one or more of 1) the number of iterations exceeds a threshold number of iterations, and 2) the difference between values of the one or more signal parameters of the knowledge base and values of the one or more signal parameters of the prior knowledge base is less than a threshold value.

In one embodiment, generating a refined estimate of the one or more signal parameters of each respective tone may include: for each respective tone of the plurality of tones, iteratively applying a single tone estimation method to the respective tone, thereby generating a refined estimate of the one or more signal parameters of the respective tone, and updating said one or more signal parameter estimates with the refined estimate of the one or more signal parameters of the respective tone.

Finally, the method may include storing and/or outputting the final one or more signal parameter estimates for each of the plurality of tones in response to iteratively generating the refined estimates.

In one embodiment of the invention the method may estimate parameters for the plurality of tones based on a frequency transform F(n), e.g., a Fourier transform of the samples of the input signal. The input signal may be windowed with a window function w(n) and transformed into the frequency domain. In a preferred embodiment, the window function is a cosine-based window function. Each tone in the input signal may express itself in the frequency domain as an additive combination of two or more spectra, e.g., one centered at the tone frequency and the other at the negative of the tone frequency. These two spectra are referred to herein as the positive frequency image and the negative frequency image respectively. A tone in the input signal may also be affected by spectra (e.g., positive or negative images) from other tones present in the signal.

Thus, in one embodiment, the method may include generating a frequency transform of the samples, where the frequency transform includes frequency response data for the plurality of tones. In this embodiment, generating a refined estimate of the one or more signal parameters of each respective tone may include: for each respective tone of the plurality of tones, generating modified frequency response data for the respective tone which operates to remove effects of other tones of the plurality of tones from the frequency response data of the respective tone, using the one or more signal parameter estimates of each of the other tones, then applying a single tone estimation method to the modified frequency response data, thereby generating a refined estimate of the one or more signal parameters of the respective tone. The refined estimate of the one or more signal parameters of the respective tone may then be used to update the one or more signal parameter estimates of the respective tone. The generating, removing effects, and updating may be performed one or more times on each of the plurality of tones to generate final one or more signal parameter estimates for each of the plurality of tones.

In one embodiment, removing effects of other tones from the frequency response data of the potential local peak of the respective tone may include: determining two or more sample values proximate to the potential local peak, and, for each of the other tones, calculating an effect value for each of the two or more sample values using the estimated signal parameters for the tone. The respective effect values from each of the two or more sample values may then be subtracted from the respective sample values to generate a corresponding two or more modified sample values, comprising the modified frequency response data. The modified frequency response data may then be usable in applying the single tone estimation method. In one embodiment, the two or more sample values may be consecutive sample values.

Said another way, the method may transform the signal to produce frequency response data, then remove the effects of the other tones from each tone's frequency response data to refine the parameter estimates. After each tone's parameters have been refined, the process may be repeated, further refining the refined estimates for each tone by using the refined estimates of the other tones to more accurately remove the effects of the other tones from the frequency response data of each tone. In other words, the refined estimates generated in each iteration may be used to remove the effects of other tones from the frequency response data of each respective tone, after which a further refined estimate may be generated for the respective tone. The method may iterate until the desired degree of refinement is achieved or some other end condition is met.

In one embodiment, the frequency transform may comprise a windowed Fast Fourier Transform (FFT) with window function W(f), where f denotes frequency, where the estimated signal parameters for the tone comprise an amplitude $A_1$, a frequency $f_1$, and a phase $\phi_1$, and where calculating an effect value for each of the two or more sample values using the estimated signal parameters for the tone may comprise calculating:

$$dF(m)=A_1 e^{-j\phi_1} W(f_m+f_1)+A_1 e^{-j\phi_1} W(f_m-f_1),$$

for each sample m, wherein m denotes an index of the sample, and $f_m$ denotes the frequency bin of the sample, and where subtracting the respective effect value from each of the two or more sample values comprises subtracting a respective value of dF(m) from each of the two or more sample values.

The plurality of tones may be processed as described one or more times to generate final one or more signal parameter estimates for each of the plurality of tones. Thus, the signal parameters for each of the plurality of tones may be estimated iteratively, updating previous parameter estimates with the refined estimates each iteration.

In one embodiment, the single tone estimation method applied to each tone may identify a frequency location proximate to an amplitude peak in the frequency transform, where the amplitude peak corresponds to the tone. Two or more frequency bins may then be selected proximate to the identified frequency location in the frequency transform. The method preferably selects one or more frequency bins located on either side of the frequency location of the amplitude peak. In other words, the method may select one or more bins located on one side of the amplitude peak and one or more bins located on the other side of the amplitude peak.

The method may then determine a tone frequency value that minimizes a difference between two or more expressions, e.g., at least a first expression and a second expression. Stated another way, the method may select a tone frequency value that makes a plurality of expressions most nearly equal.

Each of the plurality of expressions may comprise a sum of one or more numerator terms divided by a sum of one or more denominator terms, wherein:

1) each of the plurality of expressions includes a tone frequency variable;

2) each numerator term and each denominator term corresponds to one of the frequency bins; and 3) a ratio of each numerator term and its corresponding denominator term represent a complex amplitude of the tone at a respective bin.

Thus, for example, the plurality of expressions may comprise a first expression and a second expression having the above characteristics.

In each expression, the tone frequency variable may represent a correct tone frequency value of the tone. The first expression may be approximately equivalent to the second expression when the correct tone frequency value is used for the tone frequency variable in the first and second complex expressions.

The step of determining a tone frequency value may comprise computing a plurality of differences between the first expression and the second expression for different respective tone frequency values of the tone frequency variable, and then selecting the tone frequency value that produces a smallest difference. The method may compute the plurality of differences by performing a Newton-Rhapson root finding method.

The expressions may be real expressions or complex expressions. Where the expressions are complex expressions, the method may involve minimizing a difference between an amplitude of the first complex expression and an amplitude of the second complex expression.

In a preferred embodiment, the first expression and the second expression have the form:

$$\left| \frac{\sum_{k+1}^{k+M}(F(n)W^*(f_n-f_i)-F^*(n)W(f_n+f_i))}{\sum_{k+1}^{k+M}(|W(f_n-f_i)|^2-|W(f_n+f_i)|^2)} \right| = \left| \frac{\sum_{k+1}^{k+M-1}(F(n)W^*(f_n-f_i)-F^*(n)W(f_n+f_i))}{\sum_{k+1}^{k+M-1}(|W(f_n-f_i)|^2-|W(f_n+f_i)|^2)} \right|$$

wherein:
F(n) is the nth value of the single sided scaled FFT spectrum; and
W represents a window function, wherein the window function is shifted by a value of the tone frequency variable $f_i$.

When the frequency transform of the samples comprises generating a power spectrum of the samples, the first expression and the second expression have the form:

$$\left| \frac{\sum_{k+1}^{k+M}(|F(n)|\times|W(f_n-f_i)|)}{\sum_{k+1}^{k+M}|W(f_n-f_i)|^2} \right| = \left| \frac{\sum_{k+1}^{k+M-1}(|F(n)|\times|W(f_n-f_i)|)}{\sum_{k+1}^{k+M-1}|W(f_n-f_i)|^2} \right|$$

wherein:
F(n) is the nth value of the single sided scaled FFT spectrum; and
W represents a window function, wherein the window function is shifted by a value of the tone frequency variable $f_j$.

The determined tone frequency value may comprise an approximation of the correct frequency of the tone. In other words, the determined tone frequency value represents an approximation of the correct tone frequency value. The method described herein operates to find a more exact approximation of the frequency of the tone than prior art techniques, even in the presence of noise or interference from other tones, or the negative image of the respective tone being found.

After the tone frequency value has been determined, the method may comprise storing the determined tone frequency value in a memory, or outputting the determined tone frequency value, e.g., on a display or to other systems for further analysis or processing.

The method may also then compute one or more of the amplitude and phase of the tone using the determined tone frequency value. For example, once the $f_i$ value is known, the amplitude and phase can be computed as:

$$A_i e^{j\varphi_i} = C = \frac{\sum_{k+1}^{k+M}(F(n)W^*(f_n-f_i)-F^*(n)W(f_n+f_i))}{\sum_{k+1}^{k+M}(|W(f_n-f_i)|^2-|W(f_n+f_i)|^2)}$$

When the frequency transform of the samples comprises generating a power spectrum of the samples, the amplitude can be computed as:

$$A_i = \left| \frac{\sum_{k+1}^{k+M}(|F(n)|\times|W(f_n-f_i)|)}{\sum_{k+1}^{k+M}|W(f_n-f_i)|^2} \right|$$

As mentioned above, the above steps may be iteratively performed for each of the plurality of tones to determine at least one signal parameter for each of the plurality of tones in the input signal. The above method may be performed iteratively where, for each respective tone identified, the other tones effects may be subtracted from the input signal, and the above single tone estimation process performed on the signal. The process may then be repeated for the next tone, and so on, generating refined estimates for the parameters of each tone.

As also described above, once all of the tones have been refined by this subtraction, the entire process may be repeated (iterated), using the refined estimates to subtract the effects of the other tones from the signal, then performing single tone estimation on the signal. Each process iteration may generate a further refined set of parameter estimations for the tones. The process iteration may be terminated upon reaching a threshold number of iterations, or when the difference between successive estimates of the tone parameters is less than a threshold value, i.e., when the desired degree of refinement has been achieved, resulting in a final set of estimates for the tone parameters. The final estimates of the tone parameters may then be stored, or output to a display or external system.

It is noted than in other embodiments, alternative single tone estimation methods may be used in place of the above single tone estimation method, such as, for example, the method described in U.S. patent application Ser. No. 09/753,164, titled "System and Method for Estimating Tones in an Input Signal", which is incorporated by reference below.

Thus the method of the present invention operates to determine more accurate approximations of signal parameters of multiple tones present in an input signal, and operates more efficiently than prior art techniques.

BRIEF DESCRIPTION OF THE DRAWINGS

A better understanding of the present invention can be obtained when the following detailed description of the preferred embodiment is considered in conjunction with the following drawings, in which.

Figure 1A:
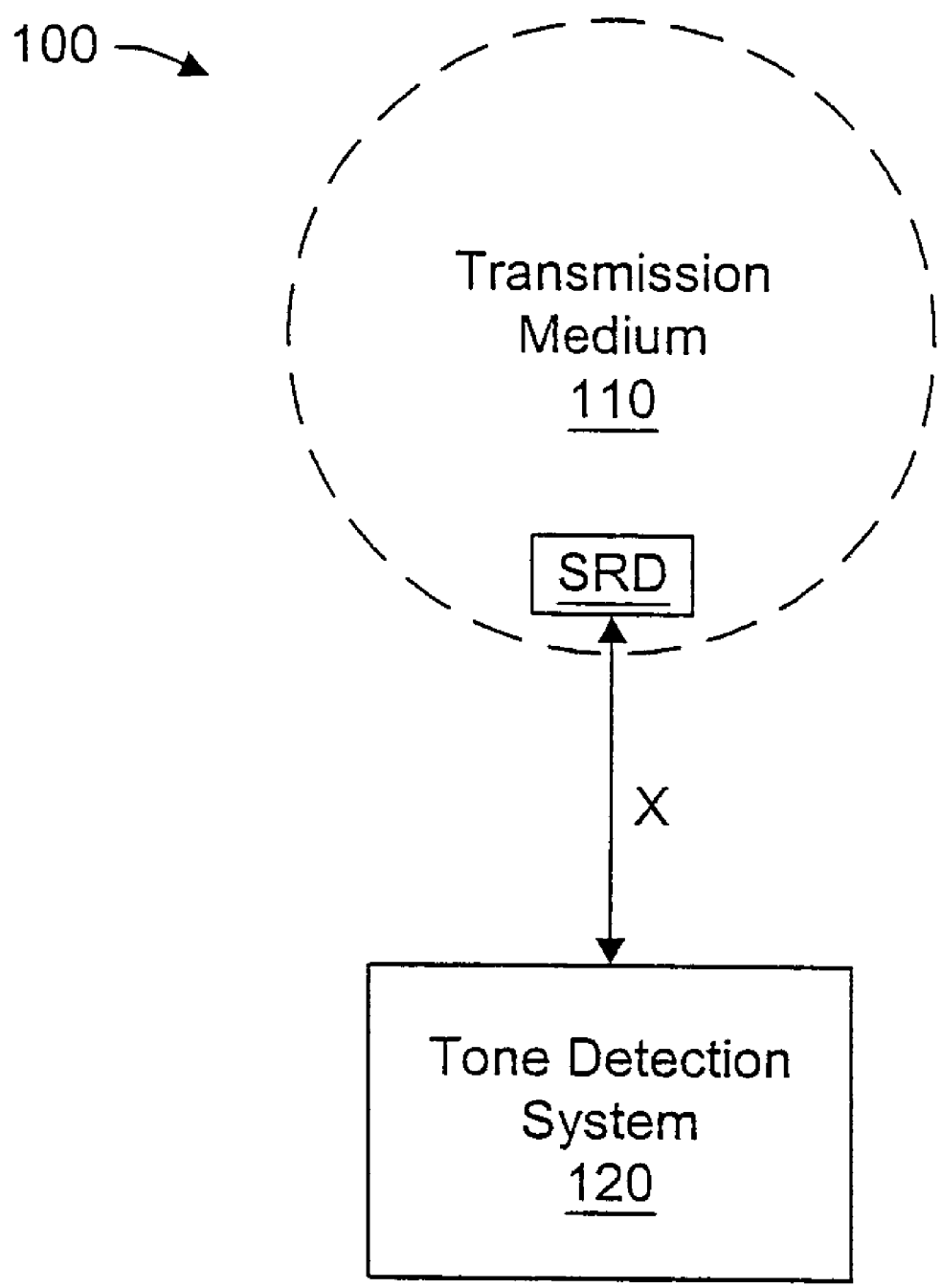
FIG. 1A illustrates a system configuration 100 for determining the signal parameters associated with one or more sinusoidal tones comprised within an input signal.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Incorporation by Reference

U.S. patent application Ser. No. 09/753,164 titled "System and Method for Estimating Tones in an Input Signal", filed Dec. 27, 2000, and whose inventor is Alain Mariot, is hereby incorporated by reference in its entirety as though fully and completely set forth herein.

U.S. patent application Ser. No. 09/880,167 titled "System and Method for Estimating One or More Tones in an Input Signal", filed Jun. 12, 2001, and whose inventors are Yong Rao and Michael Cerna, is hereby incorporated by reference in its entirety as though fully and completely set forth herein.

FIG. 1A

FIG. 1A illustrates a system configuration 100 for performing signal processing on a signal comprising a plurality of tones. System configuration 100 may comprise a signal reception device (SRD) and a tone detection system 120.

The SRD may be coupled to receive a signal from a device, unit under test (UUT) or a transmission medium 110, or any other system capable of transmitting a signal that may contain tones. The term "transmission medium" is used herein to refer generally to a device, unit under test (UUT) or a transmission medium 110 that may generate a signal including two or more tones. As used herein, the term "tone" includes a signal at a frequency, e.g., at a primary or single frequency, which may be contained within another signal or may itself be the signal. For example, the signal may comprise two or more tones and a small amount of noise. As an example, a tone may comprise a sinusoidal signal having arbitrary amplitude, frequency and phase.

As shown in FIG. 1A, the SRD may be coupled to a transmission medium 110. Transmission medium 110 may represent any of a variety of transmission media such as the atmosphere, free space, an optical fiber or fiber bundle, a communication bus (e.g. a network bus), a body of water or any other fluid, the earth, etc. In one embodiment, the transmission medium 110 is the atmosphere, and the SRD comprises an antenna and a radio receiver. In a second embodiment, the transmission medium 110 is a network bus connecting two or more computers, and the SRD is a network interface card/board. In a third embodiment, the transmission medium 110 is an optical fiber, and the SRD comprises an optical sensor. As noted above, element 110 may be any of various devices or mediums for generating or transmitting a signal.

The SRD receives an input signal from the transmission medium or device 110 and may convert the input signal into a form suitable for presentation to tone detection system 120. The input signal may be electrical or non-electrical in nature. The SRD may include analog-to-digital conversion hardware to digitize the input signal. Alternatively, analog-to-digital conversion hardware may be comprised within tone detection system 120.

In one embodiment, the SRD may comprise a measurement device such as a microphone, an accelerometer, a spatial displacement sensor, a strain gauge, a pressure sensor, a temperature sensor (e.g., a thermocouple), a radiation sensor, an optical sensor, etc, or any combination thereof. In another embodiment, the SRD may represent an array of transducers or measurement devices of one or more types. The SRD may thus be any of various transducers or sensors for receiving a signal.

Tone detection system 120 may couple to the SRD to receive the input signal. In an alternate embodiment, the tone detection system 120 may be operable to receive the input signal from a memory, wherein the input signal was previously acquired and stored in the memory.

Figure 1B:
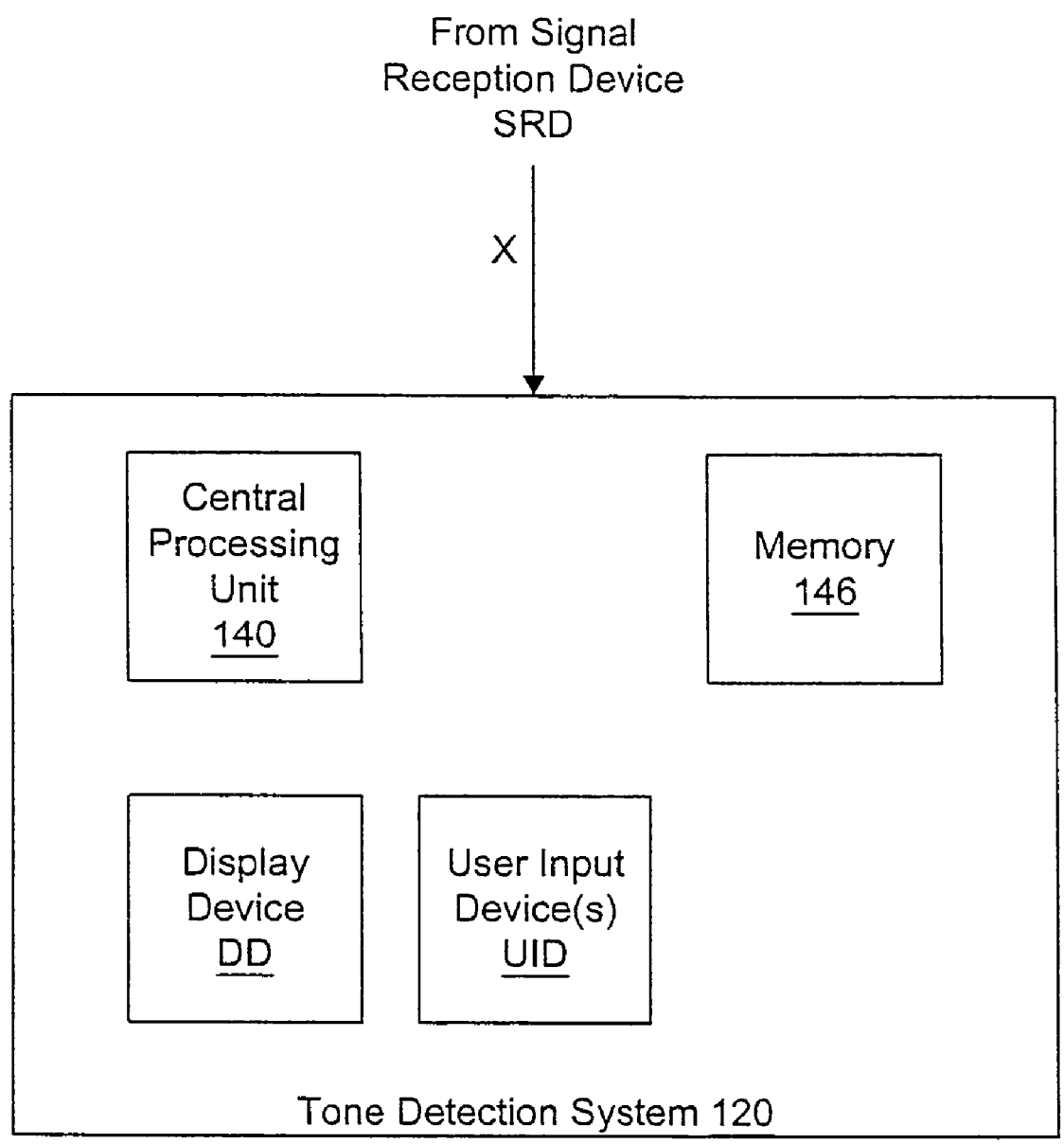
FIG. 1B illustrates one embodiment for tone detection system 120.

Tone detection system 120 may be configured for detecting the frequency, amplitude and/or phase of a plurality of tones in the input signal. Tone detection system 120 may comprise a processor or central processing unit (CPU) 140, memory 146, user input device(s) UID and a display device DD as shown in FIG. 1B. CPU 140 may be realized by any of a variety of computational devices such as a general purpose processor, a digital signal processor, a parallel processor, dedicated digital and/or analog circuitry, programmable gate array logic (e.g., an FPGA), etc., or any combination thereof. Memory 146 may comprise any of a variety of memory devices such as random access memory (RAM) and/or read-only memory (ROM), as described further below. Tone detection system 120 may also include specialized data acquisition and/or signal conditioning hardware, interface hardware, etc., or any combination thereof.

Tone detection system 120 may comprise any of various devices, such as a programmable computer system, a computer-based system such as a VXI-based system, a PXI-based system, a GPIB-based system, a computer-based data acquisition system, or a dedicated test instrument, such as a dynamic signal analyzer, an oscilloscope or any other signal acquisition and/or analysis device.

Tone detection system 120 may operate on samples of the input signal X generated by the SRD and thus may identify the frequency, phase and/or amplitude of multiple tones in the input signal. The frequency, phase and/or amplitude of the tones may be presented to a user through the display device DD or some other output device, may be further processed by a software program executing in the tone detection system 120, may be provided to another system for processing, and/or may be stored to memory for future use.

User input device(s) UID may comprise a keyboard, a pointing device such as a mouse or trackball, a touch pad (such as those used in modern laptop computers for cursor control), a touch sensitive display screen, etc., or other input devices. In one embodiment, user input device(s) UID may include use of a graphical user interface or panel configured with various control icons such as buttons, knobs, sliders, switches, indicators, etc., or any combination thereof. A user provides input to tone detection system 120 through user input device(s). Tone detection system 120 may manage a graphical user interface through display device DD and user input device(s) UID.

Figure 2A:
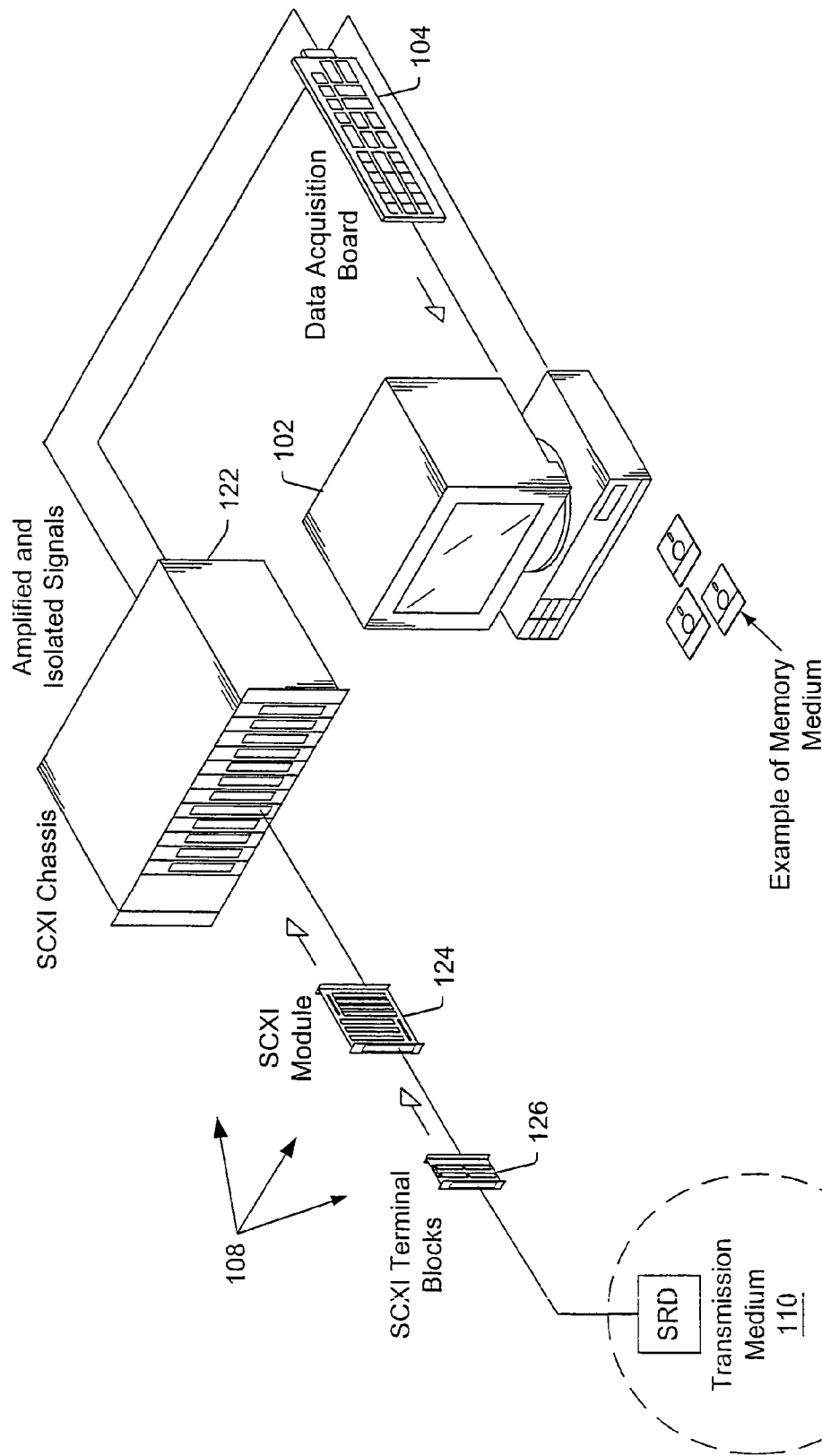
FIG. 2A illustrates one embodiment of tone detection system 120 comprising a computer-based measurement or data acquisition system, where signals generated by a signal reception device (SRD) are presented to computer 102 through signal conditioning system 108 and data acquisition (DAQ) device 104.
Figure 2B:
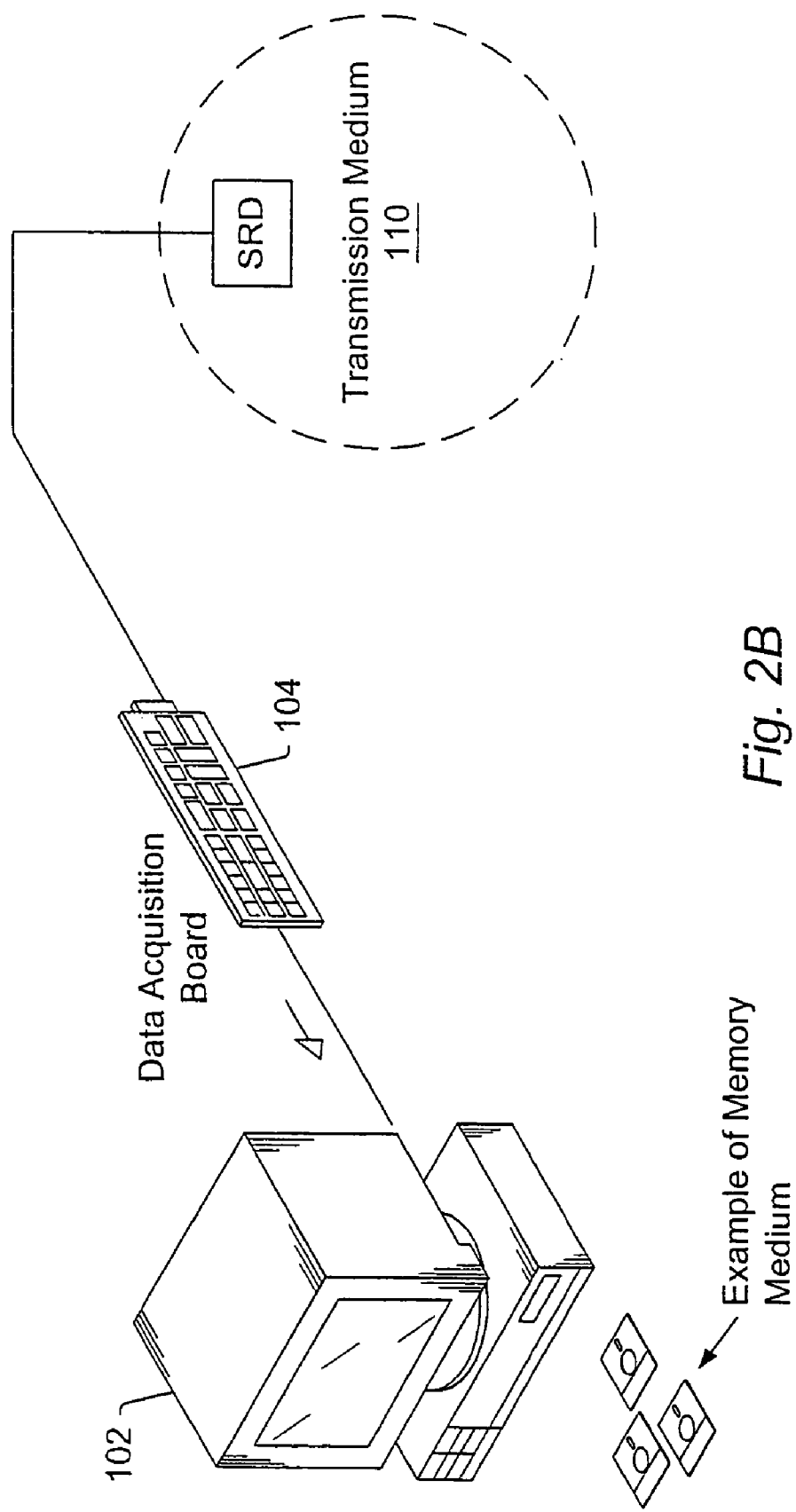
FIG. 2B illustrates a second embodiment of tone detection system 120 comprising a computer-based measurement system, where signals generated by a signal reception device (SRD) are presented to computer system 102 through data acquisition (DAQ) device 104.

FIGS. 2A and 2B

FIGS. 2A and 2B illustrate exemplary embodiments of tone detection system 120. As shown, tone detection system 120 may comprise a computer 102, a data acquisition (DAQ) device 104 coupled to the computer 102, and optionally a signal conditioning system 108 coupled to the DAQ device 104. The SRD may comprise transducers, sensors, and/or receiving devices that couple to DAQ device 104 through the signal conditioning circuitry 108.

As shown, the SRD is configured and/or coupled to acquire signals from the transmission medium 110. The input signals acquired by the SRD may be optionally conditioned by the signal conditioning system 108 as shown in FIG. 2A. The conditioned input signals may then be provided to DAQ device 104 as shown. Signal conditioning system 108 may connect to DAQ device 104 via one or more cables.

In one embodiment, signal conditioning system 108 may comprise an external chassis 122 housing one or more signal conditioning modules 124 and optionally terminal blocks 126. Signal conditioning system 108 may be used to perform signal conditioning on the signals generated by the SRD. As used herein, the term "signal conditioning" may include one or more of amplifying, linearizing, limiting, isolating, filtering, switching and/or multiplexing signals), among other signal processing functions. Signal conditioning system 108 may advantageously reduce the level of noise in the signals transmitted to DAQ device 104. DAQ device 104 may receive conditioned signals from signal conditioning system 108 as shown in FIG. 2A. Alternatively, DAQ device 104 may directly receive the input signal from the SRD as shown in FIG. 2B. DAQ device 104 may operate to perform analog to digital (A/D) conversion and provide the resultant digital signals to computer 102 for processing.

Computer system 102 may include various standard components, including a processor or central processing unit (CPU) 140, system memory 146, non-volatile memory, one or more buses, and a power supply. DAQ device 104 may be a specialized system for acquiring digital and/or analog signals from external devices. Thus, DAQ device 104 may include analog to digital (A/D) conversion circuitry and/or digital to analog (D/A) conversion circuitry. Examples of the DAQ device 104 include "E series" DAQ boards from National Instruments Corporation. DAQ device 104 may also comprise a computer-based instrument board, such as an oscilloscope, a digital multimeter (DMM), a dynamic signal analyzer, an arbitrary waveform generator, etc.

In one embodiment, computer 102 may comprise input/output (I/O) slots into which DAQ device 104 may be coupled. In another embodiment, computer 102 may comprise a VXI (VME Extensions for Instrumentation) chassis and bus, a GPIB (General Purpose Interface Bus) interface card, a serial port or parallel port by which DAQ device 104 may be coupled to the computer 102.

Tone detection system 120, e.g., computer system 102, preferably includes at least one memory medium on which computer programs according to the present invention may be stored. The term "memory medium" is intended to include various types of memory or storage, including an installation medium, e.g., a CD-ROM, or floppy disks 104; a computer system memory or random access memory such as DRAM, SRAM, EDO RAM, Rambus RAM, EPROM, EEPROM etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network. In the latter instance, the second computer may provide the program instructions to the first computer for execution. Also, the computer system 102 may take various forms, including a personal computer system, mainframe computer system, workstation, network appliance, Internet appliance, personal digital assistant (PDA), television system, dedicated test or measurement instrument or other device. In general, the term "computer system" can be broadly defined to encompass any system having a processor which executes instructions from a memory medium.

The memory medium preferably stores a software program according to one embodiment of the present invention for detecting multiple tones in the input signal. More particularly, the software program may be operable to analyze the input signal to determine the frequency, phase and amplitude of multiple tones in the input signal.

The software program may be implemented in any of various ways, including procedure-based techniques, component-based techniques, object-oriented techniques, or neural net based learning techniques, among others. For example, the software program may be implemented using ActiveX controls, C++ objects, Java objects, Microsoft Foundation Classes (MFC), or other technologies or methodologies, as desired. A processor, such as the host CPU, executing code and data from the memory medium, or a programmable device configured according to a net list, may comprise embodiments of a means for determining the frequency, phase and amplitude of the tones embedded in the input signal according to the methods described below.

As noted above, the tone detection system 120 may also or instead include reconfigurable logic or programmable logic, such as an FPGA, that implements the methods described herein.

Various embodiments further include receiving, storing, and/or transmitting instructions and/or data implemented according to the present invention upon a carrier medium. Suitable carrier media include a memory medium as described above, as well as signals such as electrical, electromagnetic, or digital signals, conveyed via a communication medium such as networks and/or a wireless link.

Multiple Tone Estimation

As mentioned above, in many applications, the received signal includes a plurality of tones. Various embodiments of a method for estimating the signal parameters for each of a plurality of tones in a received signal are described below with reference to FIGS. 3–9B. In particular, various embodiments of a method are described which may be used to identify and estimate signal parameters of a plurality of tones in a signal, compensating for the effects of both the negative image of each tone, and the positive and negative images of the other tones present in the signal. In estimating the signal parameters for the plurality of tones, the method preferably utilizes a single tone estimation method. Exemplary embodiments of such a single tone estimation method are described below with reference to FIGS. 10–18B.

Figure 3:
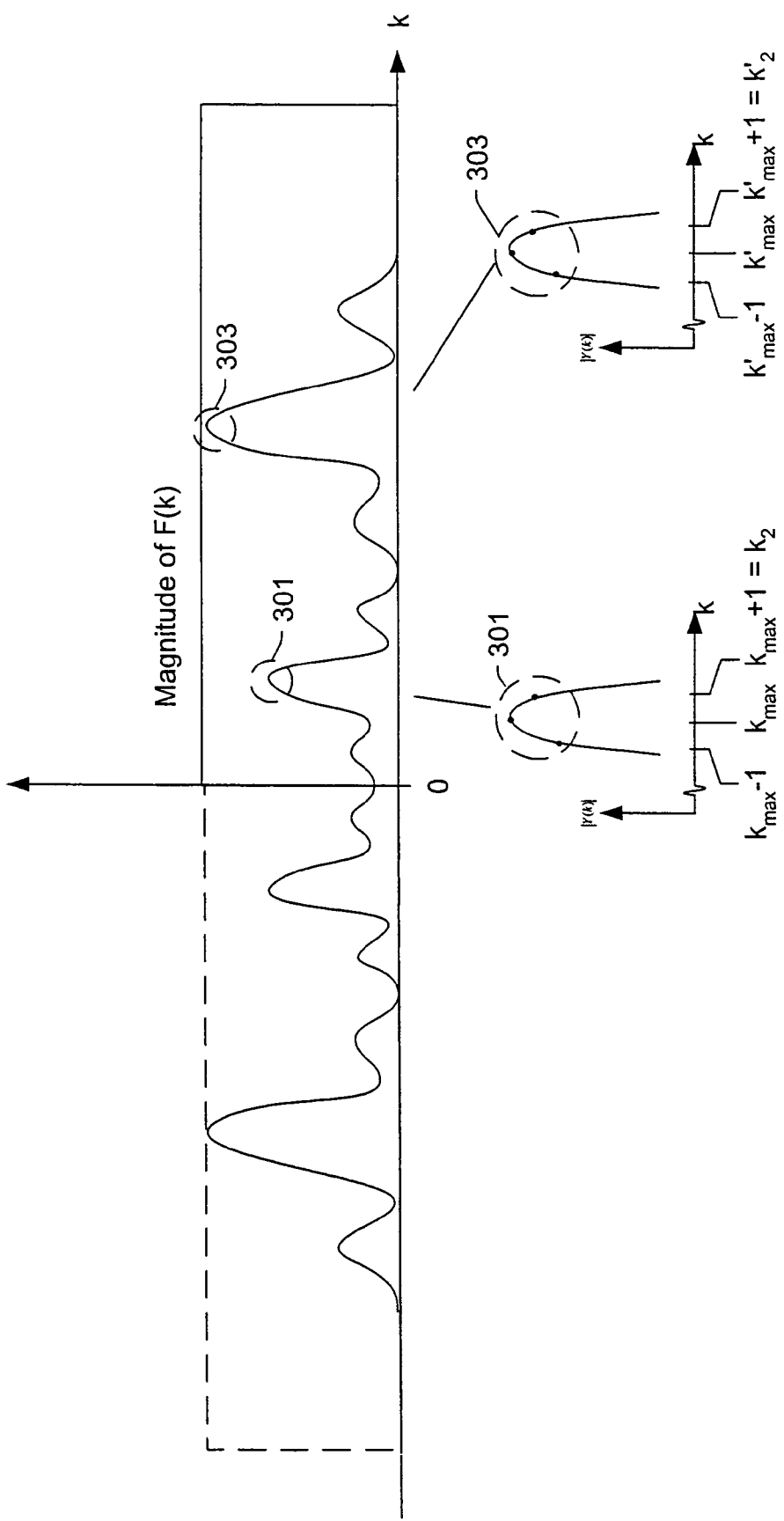
FIG. 3 illustrates peak magnitudes of transform array F(k) for a typical windowed input signal comprising multiple sinusoidal tones.

FIG. 3—Frequency Response Data with Multiple Tones

FIG. 3 is a plot of the magnitude of a transform F(n) corresponding to a typical windowed input signal x(n), illustrating frequency response data generated by the frequency transform F(n) of a signal containing multiple tones, where the horizontal k axis denotes frequency. As FIG. 3 shows, each tone is represented by a pair of peaks symmetrically located about the origin—one at the positive frequency, and another at the negative frequency. The positive peak for each tone may be detected and characterized using the transform values in the neighborhood of, or proximate to, the peak.

It is noted that in defining a peak, e.g., peak 301, the maximum of magnitude function |F(n)| considered as a function of continuous frequency typically does not occur at the integer value $k_{max}$, although it should occur somewhere in the interval between $k_{max}$ and the next highest amplitude sample adjacent to $k_{max}$. A comparison of amplitude at $k_{max}-1$ and $k_{max}+1$ may be made to determine whether the second largest magnitude occurs at $k_{max}-1$ or $k_{max}+1$. Let $k_2$ denote the location of this second largest magnitude. FIG. 3 illustrates a blowup of the positive frequency magnitude peak 301 in the neighborhood of bin index value $k_{max}$, and a second positive frequency magnitude peak 303 in the neighborhood of bin index value $k'_{max}$. In the example of FIG. 3, peak 301, the frequency bins $k_{max}-1$ and $k_{max}+1$ may be used as the bins proximate to the frequency producing the positive maximum amplitude. Although in this example, three data points are used to define a peak, it is noted that in other embodiments two points may be used to define each peak, or alternatively, four or more points may be used.

Figure 4:
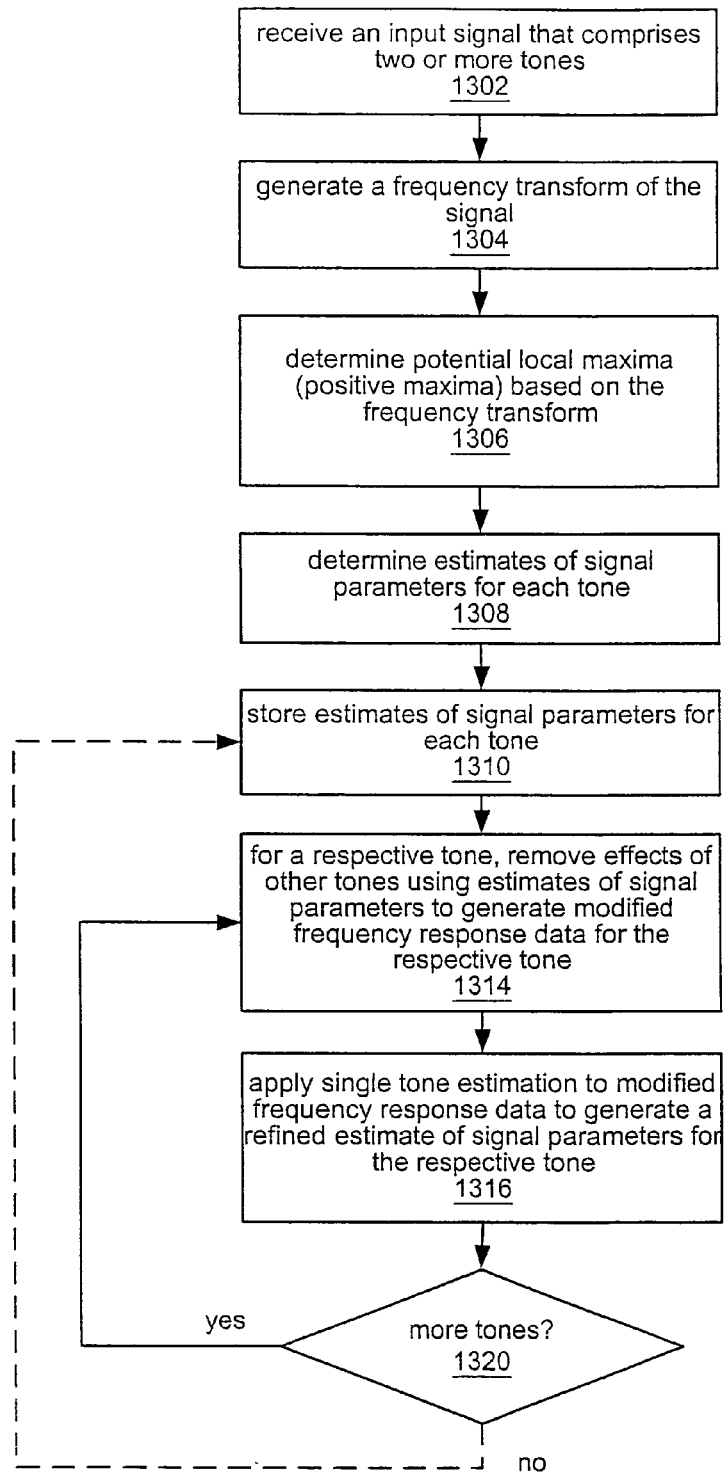
FIG. 4 flowcharts a method for estimating parameters for multiple tones in a signal, according to one embodiment.

FIG. 4—Flowchart of a Method for Multi-Tone Estimation

FIG. 4 flowcharts one embodiment of a method for detecting multiple tones in a signal. It is noted that in other embodiments, some of the steps may occur in a different order than shown, or may be omitted. Additional steps may also be performed as desired. In a preferred embodiment, the method may be implemented by one or more tone detection software programs executed by a processor, e.g., in a computer system. The programs may be stored in a memory medium coupled to the processor. In another embodiment, the method may be implemented in programmable hardware, such as an FPGA. In further embodiments, the method may be implemented by a combination of software and hardware.

As FIG. 4 shows, in 1302 an input signal may be received which contains two or more tones. In other words, samples of the signal may be received, such as through an input of the computer system, where the signal samples include a plurality of tones.

In 1304, a frequency transform of the signal samples may be generated, resulting in frequency response data for the plurality of tones. In one embodiment, the frequency transform is a windowed Fast Fourier Transform, i.e., a windowed Discrete Fourier Transform, as described below with reference to FIGS. 10 and 11. As is known in the art, the frequency response data includes amplitudes corresponding to each frequency value in the signal spectrum.

Figure 5:
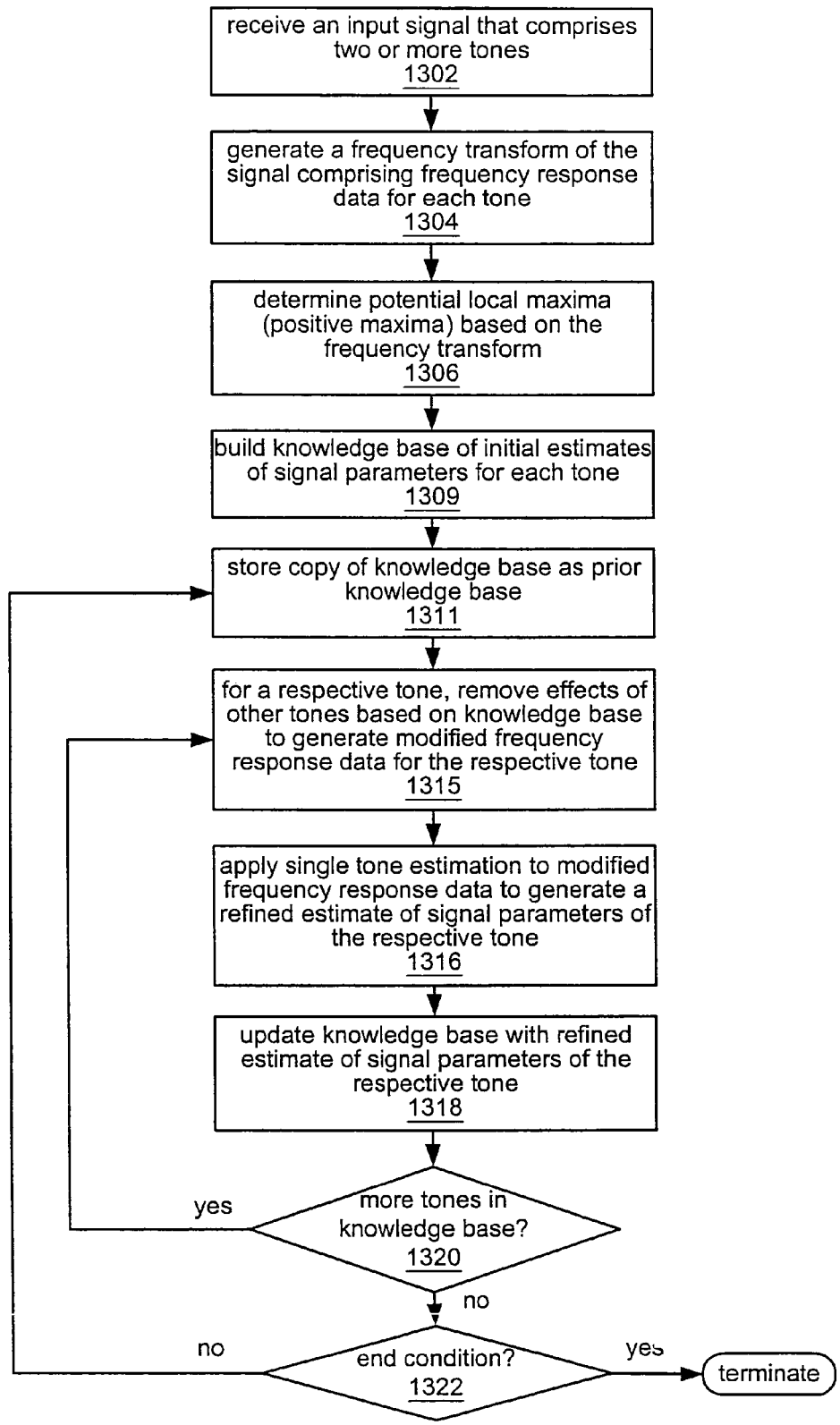
FIG. 5 flowcharts a more detailed embodiment of the method of FIG. 4.

In 1306, a plurality of potential local peaks may be determined based on the frequency response data, where each potential local peak corresponds to a tone in the signal. Said another way, a plurality of potential local maxima (positive peaks) may be determined based on the frequency transform. In one embodiment, the peaks or maxima may be determined by locating sample amplitudes exceeding a predetermined threshold. It should be noted that the term "potential" is used because each potential peak is defined by two or more discrete samples or data points, and the actual peak amplitude generally occurs between two of the samples, as indicated in FIG. 5. In other words, it is unlikely that one of the discrete samples lies precisely at the peak or local maxima, thus, the sample values defining each peak indicate a potential peak, which may be refined as described below.

In 1308, one or more signal parameter estimates characterizing each of the plurality of tones may be determined based on the plurality of potential local peaks. These estimates may be considered initial estimates which provide a rough starting point for the estimation process described below. In one embodiment, the one or more signal parameter estimates may include estimates for one or more of frequency f, amplitude A, and phase $\phi$, for each tone. In a preferred embodiment, the estimate of frequency may be the frequency value of the determined potential local peak, i.e., the frequency value of the maximum sample amplitude for that local peak. The initial estimate of amplitude may be zero. Similarly, the initial estimate of phase may be zero. Thus, for each potential local peak, i.e., for each tone, initial estimates may be determined which characterize the tone associated with each potential local peak in the frequency response data.

In 1310, the one or more signal parameter estimates characterizing each of the plurality of tones may be stored, e.g., in the memory medium of the computer system. In one embodiment, storing the one or more signal parameter estimates for each of the plurality of tones may include sorting the signal parameter estimates for the plurality of tones by the amplitude of the potential local peaks. In other words, the tone parameters may be sorted by descending peak amplitude.

Steps 1314 and 1316 may then be performed for each estimated tone, i.e., for each tone whose initial parameter estimates have been determined and stored, as shown in FIG. 4 and described below.

For each respective tone, in 1314, the effects of the other tones of the plurality of tones may be removed from the frequency response data of the tone. Said another way, the influence of each of the other tones may be subtracted from the samples defining the respective tone's potential local peak. In one embodiment, removing the effects of other tones from the frequency response data of the potential local peak of the tone includes determining two or more sample values proximate to the potential local peak, then, for each of the other tones, calculating an effect value for each of the two or more sample values using the estimated signal parameters for the tone. The respective effect values may then be subtracted from each of the two or more sample values, thereby generating a corresponding two or more modified sample values. Thus, the original sample data defining the potential local peak may be modified to produce new sample data with the effects of the other tones removed.

As mentioned above, in one embodiment, the estimated signal parameters for each tone include an amplitude $A_1$, a frequency $f_1$, and a phase $\phi_1$, and the frequency transform is a windowed Fast Fourier Transform (FFT) with window function W(f), where f denotes frequency. In this embodiment, the effect value of each of the tones may be calculated for each of the two or more sample values by the following expression:

$$dF(m) = A_1 e^{-j\phi_1} W(f_m + f_1) + A_1 e^{-j\phi_1} W(f_m - f_1),$$

where m denotes an index of the sample, and $f_m$ denotes the frequency value or bin of the sample. As noted above, the amplitude $A_1$, frequency $f_1$, and phase $\phi_1$, are the estimated parameters used to characterize each of the other tones. Thus, subtracting the respective effect value of each tone from each of the two or more sample values includes calculating and subtracting a respective value of dF(m) from each of the two or more sample values, per tone to be removed. Thus, the method may iterate through each of the other tones, calculating and removing each tone's effect from each of the samples. It is noted that in the first pass through the process, the initial estimated amplitude $A_1$, and phase $\phi_1$, may be zero, and so the calculated effect value dF(m) for each of the other tones may be zero for the first respective tone. In an embodiment where the stored tone parameters are sorted (e.g., base on peak amplitude), step 1314 may process the tones in the sorted order. This may increase the efficiency of the estimate refinement process.

After the removal of effects of the other tones in 1314, a single tone estimation method may be applied to the modified frequency response data to generate a refined estimate of signal parameters for the tone, as indicated in 1316. The refined estimate of the signal parameters of the tone may replace the original estimate of the signal parameters, and thus may be used in subsequent calculations of the effect value of the tone, e.g., when calculating the effect of the tone on each of the other tones. It is noted that the single tone estimation method of 1316 preferably comprises the single tone estimation method described below with reference to FIGS. 10–13, or variations thereof.

As indicated in 1320, if there are more tones to be estimated, then the method may continue with 1314 above, performing steps 1314 and 1316 for each tone, thereby generating a refined estimate of the signal parameters for each of the tones in the signal.

In one embodiment, if in 1320, it is determined that there are no more tones to be processed, then the method may repeat steps 1310 through 1320 one or more times, storing the refined estimates of the signal parameters of the tones, using the refined estimates to remove the effects of the other tones from each tone, and applying the single tone estimation method to each tone to generate further refined estimates. In other words, the refinement process may be repeated one or more times, where the removal of effects performed in 1314 may be more accurate with each succeeding iteration. Further details of such an iterative approach to estimation refinement are presented below with reference to FIG. 5.

FIG. 5—Detailed Flowchart of a Method for Multi-Tone Estimation

FIG. 5 is a detailed flowchart of another embodiment of a method for detecting multiple tones in a signal. As mentioned above, in various embodiments, some of the steps may occur in a different order than shown, or may be omitted. Additional steps may also be performed as desired. As may be seen, several of the steps described below are substantially the same as corresponding steps of the method of FIG. 4, and descriptions thereof may be abbreviated.

As FIG. 5 shows, in 1302 an input signal may be received which contains two or more tones. In other words, samples of the signal may be received, where the signal samples include a plurality of tones.

In 1304, a frequency transform of the signal samples may be generated, resulting in frequency response data for the plurality of tones. The frequency transform is preferably a windowed Fast Fourier Transform, i.e., a windowed Discrete Fourier Transform, as described below with reference to FIGS. 10 and 11.

In 1306, a plurality of potential local peaks may be determined based on the frequency response data, where each potential local peak corresponds to a tone in the signal.

Then, in 1309, a knowledge base may be built based on the plurality of potential local peaks. In one embodiment, the knowledge base may include one or more signal parameter estimates characterizing each of the plurality of tones. As mentioned above in 1308, these estimates may be considered initial estimates which provide a rough starting point for the estimation process described below, and may include estimates for one or more of frequency f, amplitude A, and phase $\phi$, for each tone. As also mentioned above, in a preferred embodiment, the frequency estimate may be the frequency value of the determined potential local peak, i.e., the frequency value of the maximum sample amplitude for that local peak, and the initial estimates of amplitude and/or phase may be zero. Thus, a knowledge base may be generated which contains initial estimates for one or more signal parameters for each tone.

In one embodiment, the tone parameter estimates in the knowledge base may be sorted. For example, the tone parameters may be sorted by amplitude of the corresponding potential local peaks. Subsequent processing of the tones may then be performed in the sorted order.

In 1311, a copy of the knowledge base built in 1309 may be stored as a prior knowledge base, e.g., in the memory medium of the computer system. In other words, a copy of the knowledge base may be saved for later use by the method, where the stored copy comprises a "prior version" of the knowledge base.

Then, as FIG. 5 shows, steps 1315, 1316, and 1318 may be performed for each estimated tone, i.e., for each tone whose parameter estimates have been determined and stored in the knowledge base. Thus, for each respective tone represented in the knowledge base, in 1315, the effects of the other tones of the plurality of tones may be removed from the frequency response data of the tone, similar to step 1314 of FIG. 4 above.

After the removal of effects of the other tones in 1315, a single tone estimation method may be applied to the modified frequency response data to generate a refined estimate of signal parameters for the tone, as previously indicated in 1316. As noted above, the single tone estimation method of 1316 preferably comprises the single tone estimation method described below with reference to FIGS. 10–13, or variations thereof.

Then, in 1318, the knowledge base may be updated with the refined estimate generated in 1316. It is noted that this update of the knowledge base preferably does not modify the stored "prior" knowledge base from 1311. Maintaining a prior version of the knowledge base allows comparison of the two versions to assess the need for further refinement of the estimates, as described below with respect to the determination of end conditions.

As indicated in 1320, if there are more tones to be estimated, then the method may continue with 1315 above, performing steps 1315, 1316, and 1318 for each tone, thereby generating an updated knowledge base containing the refined estimates of the signal parameters for each of the tones in the signal.

If in 1320, it is determined that there are no more tones to be processed, then in 1322, a determination may be made as to whether an end condition is met. If the end condition is met, the method may terminate, as shown. It is noted that this conditional controls the iteration of steps 1311, 1315, 1316, 1318, and 1320, described above. Examples of the end condition are presented below. Thus, the method may continue with step 1311, storing the updated knowledge base of refined estimates as a new "prior" knowledge base, i.e., replacing the old prior knowledge base. The method may then repeat steps 1311–1320, until the end condition of 1322 is met, using each successive updated knowledge base to remove the effects of the other tones from each tone, and applying the single tone estimation method to each tone to generate further refined estimates. In other words, the refinement process of steps 1315–1320 may be repeated one or more times. Because the updated knowledge base is used to remove the effects of the other tones from each tone, and the knowledge base is updated every iteration, the removal of effects performed in 1315 may be more accurate with each succeeding iteration.

In one embodiment, the end condition of 1322 may comprise the number of iterations meeting or exceeding a threshold number, e.g., four. In another embodiment, in 1322, the difference between values of the signal parameters of the updated knowledge base and values of the signal parameters of the prior knowledge base may be calculated, and if the difference is less than a threshold value, the iteration may terminate. In yet another embodiment, either of both conditions may terminate the iteration. Thus, if the refinement process of steps 1315–1318 do not change or improve the parameter values of the knowledge base more than the threshold value, the method may terminate. In one embodiment, the latest version of the knowledge base, i.e., the latest version of the refined signal parameters of the tones, may be output, where the refined signal parameters comprise final estimates of the signal parameters of the tones.

Example Graphical Program for Multi-Tone Detection

FIGS. 6A–9B comprise screen shots of a portion of a graphical program which implements one embodiment of the invention. FIGS. 6A–9B comprise screen shots of a portion of a graphical program or Virtual Instrument (VI) written in the LabVIEW graphical programming language. The graphical program is hierarchical in nature, where FIGS. 6A and 6B comprise the top level front panel and block diagram, and FIGS. 7A/B, 8A/B, and 9A/B are various sub programs or sub-VIs of the program. Various other sub programs or sub-VIs of this graphical program that are not necessary to an understanding of this embodiment of the invention are not included.

Figure 6A:
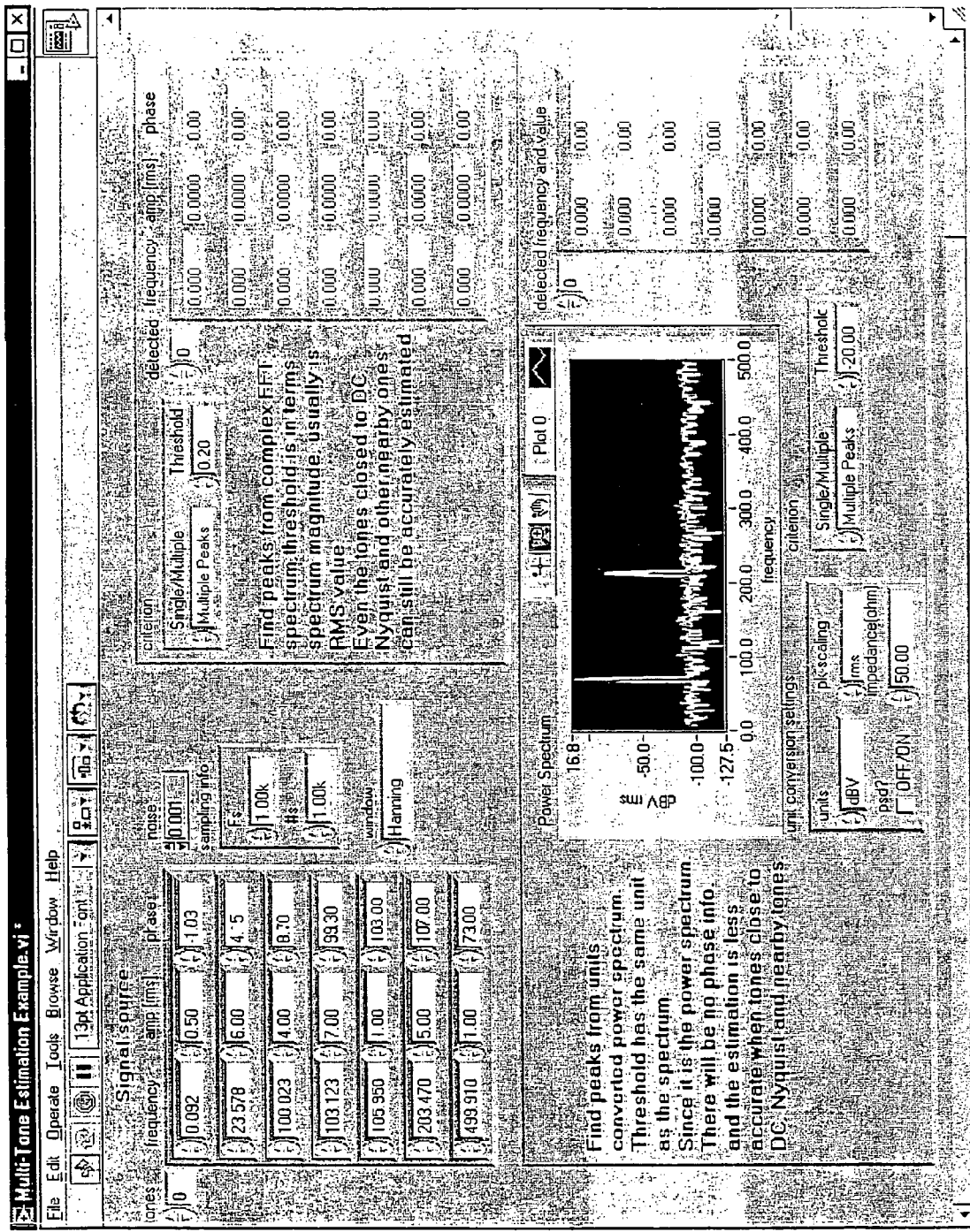
FIGS. 6A and 6B, 7A and 7B, 8A and 8B, and 9A and 9B illustrate front panels and block diagrams of a portion of a graphical program that implements one embodiment of the method of FIG. 5.
Figure 6B:
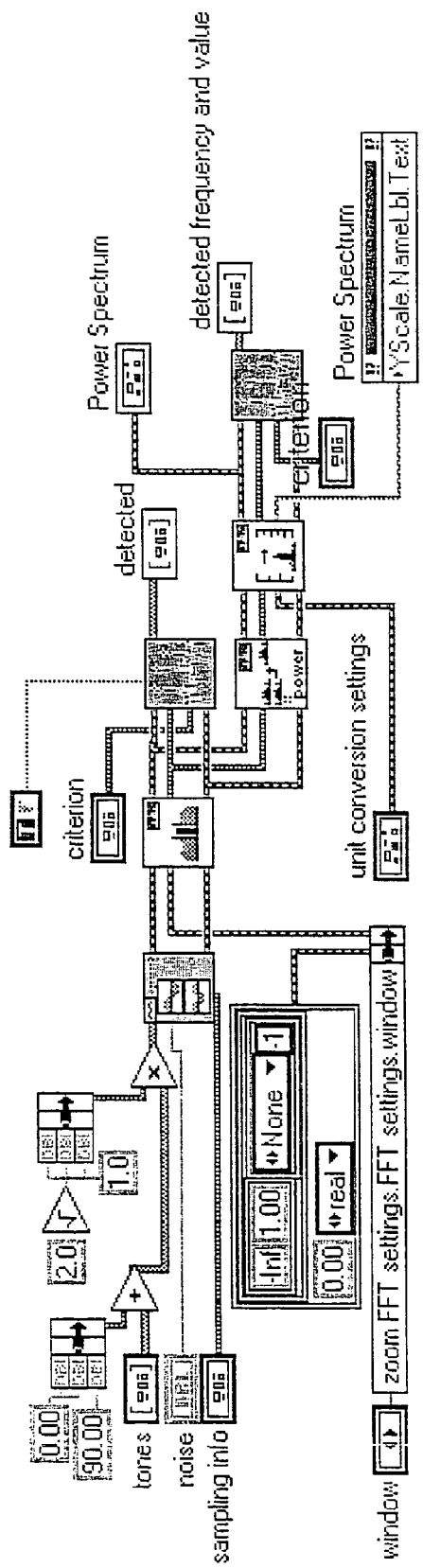

FIGS. 6A and 6B illustrate a top level front panel and block diagram, respectively, of the graphical program titled "multi-tone estimation example". As may be seen in FIG. 6A, this panel provides a top level interface for the user to configure the multi-tone estimation process, as well as to view the results of the process. As FIG. 6B shows, this graphical program block provides top level control and execution of the multi-tone estimation process. This graphical program includes a block titled "spectrum peak tone search and estimation (FFT spectrum)".

Figure 7A:
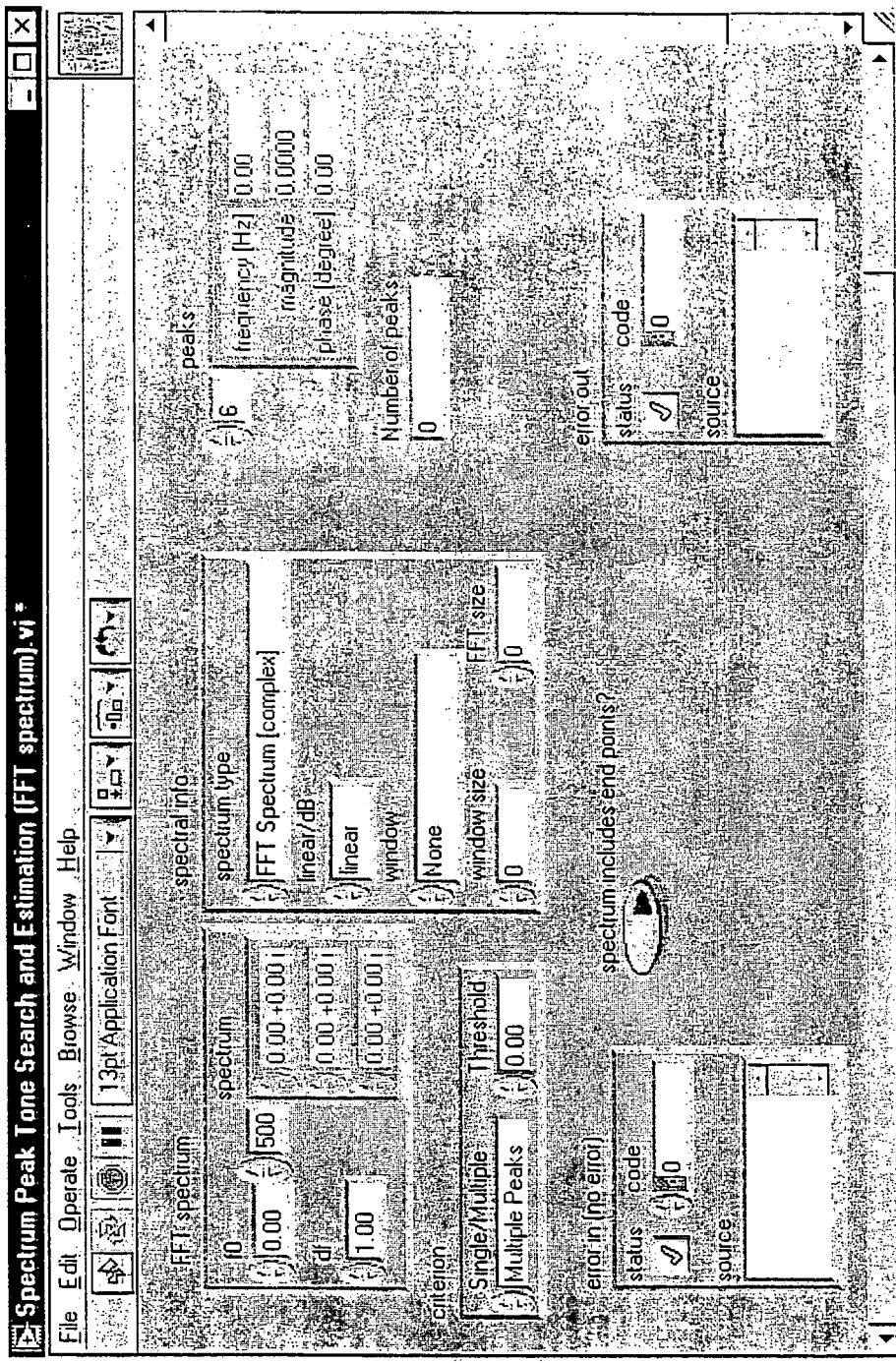
Figure 7B:
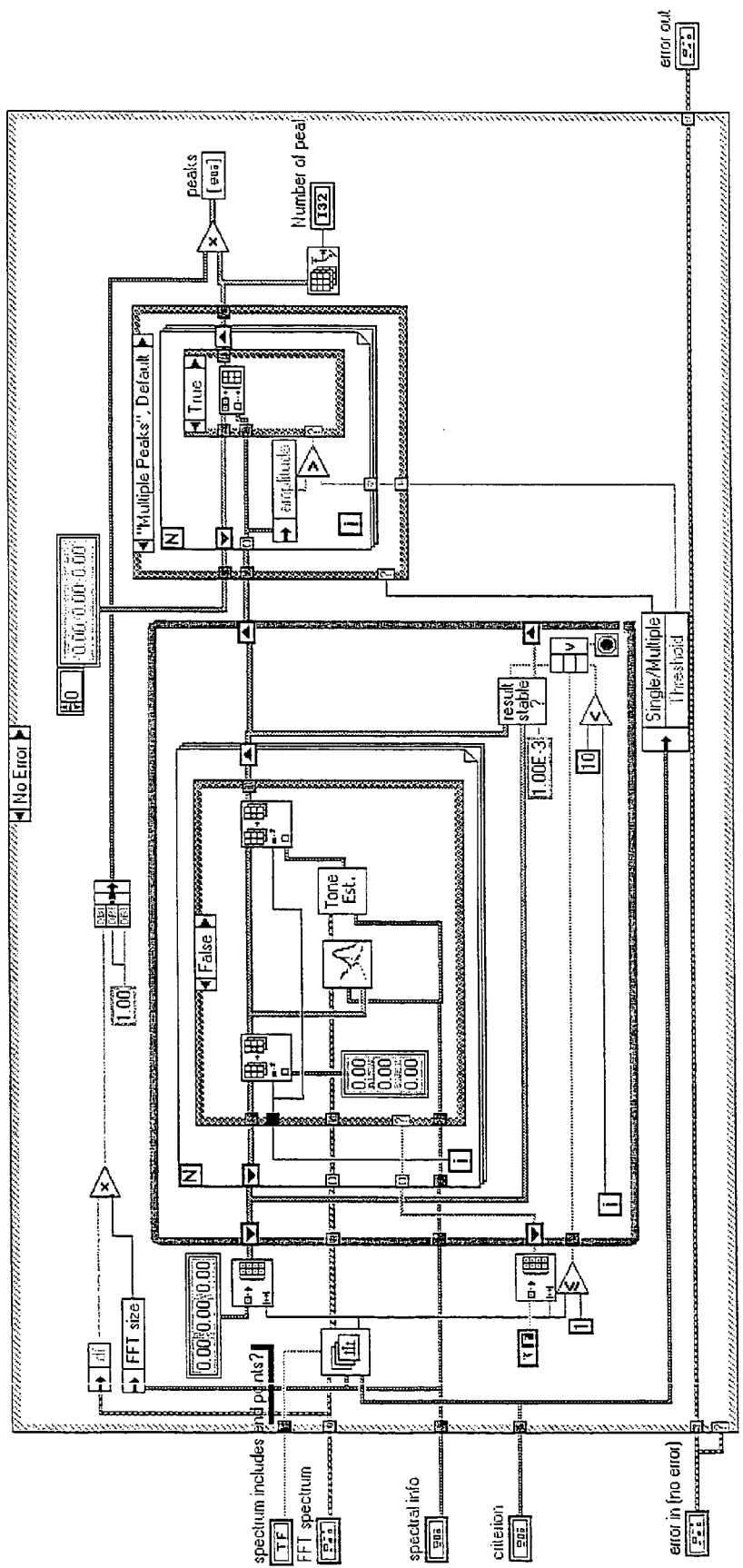

FIGS. 7A and 7B illustrate a front panel and block diagram, respectively, of the graphical program block titled "spectrum peak tone search and estimation (FFT spectrum)" contained in the diagram of FIG. 6B. This graphical program provides the primary functionality of the invention, including blocks titled "spectrum compensation from other tones" and "SML tone estimation (FFT input)".

Figure 8A:
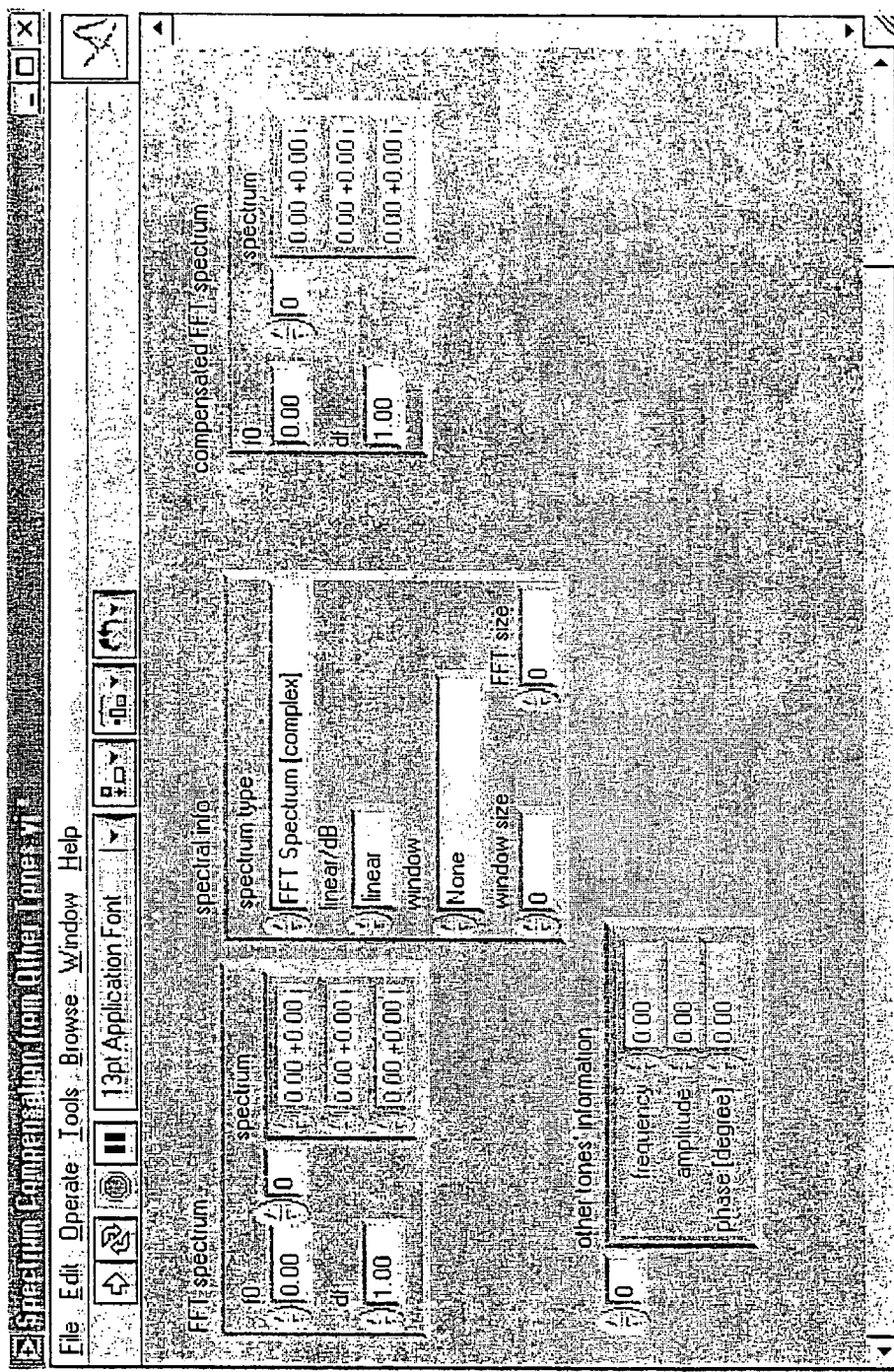
Figure 8B:
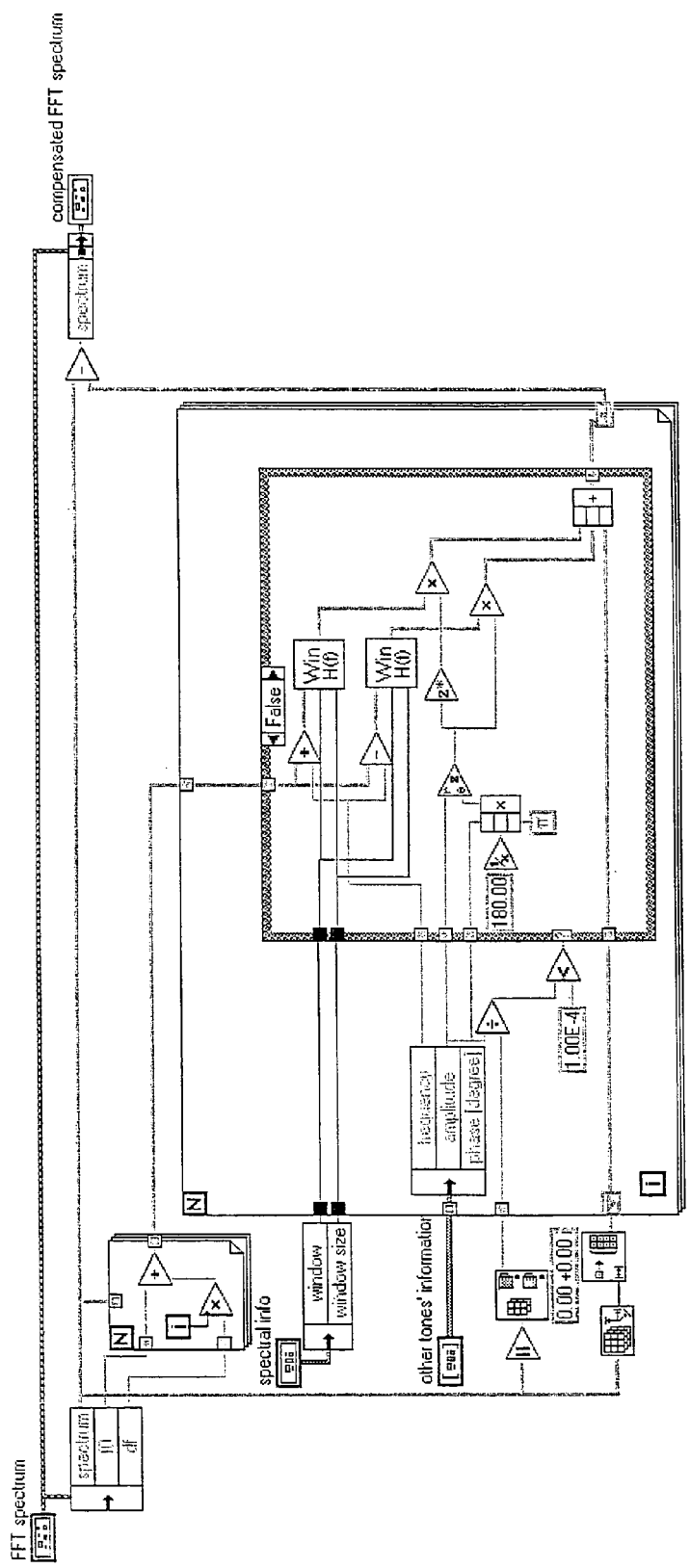

FIGS. 8A and 8B illustrate a front panel and block diagram, respectively, of the graphical program block titled "spectrum compensation from other tones" contained in the diagram of FIG. 7B. As the title indicates, this graphical program calculates and removes the effects of the other tones from a given tone.

Figure 9A:
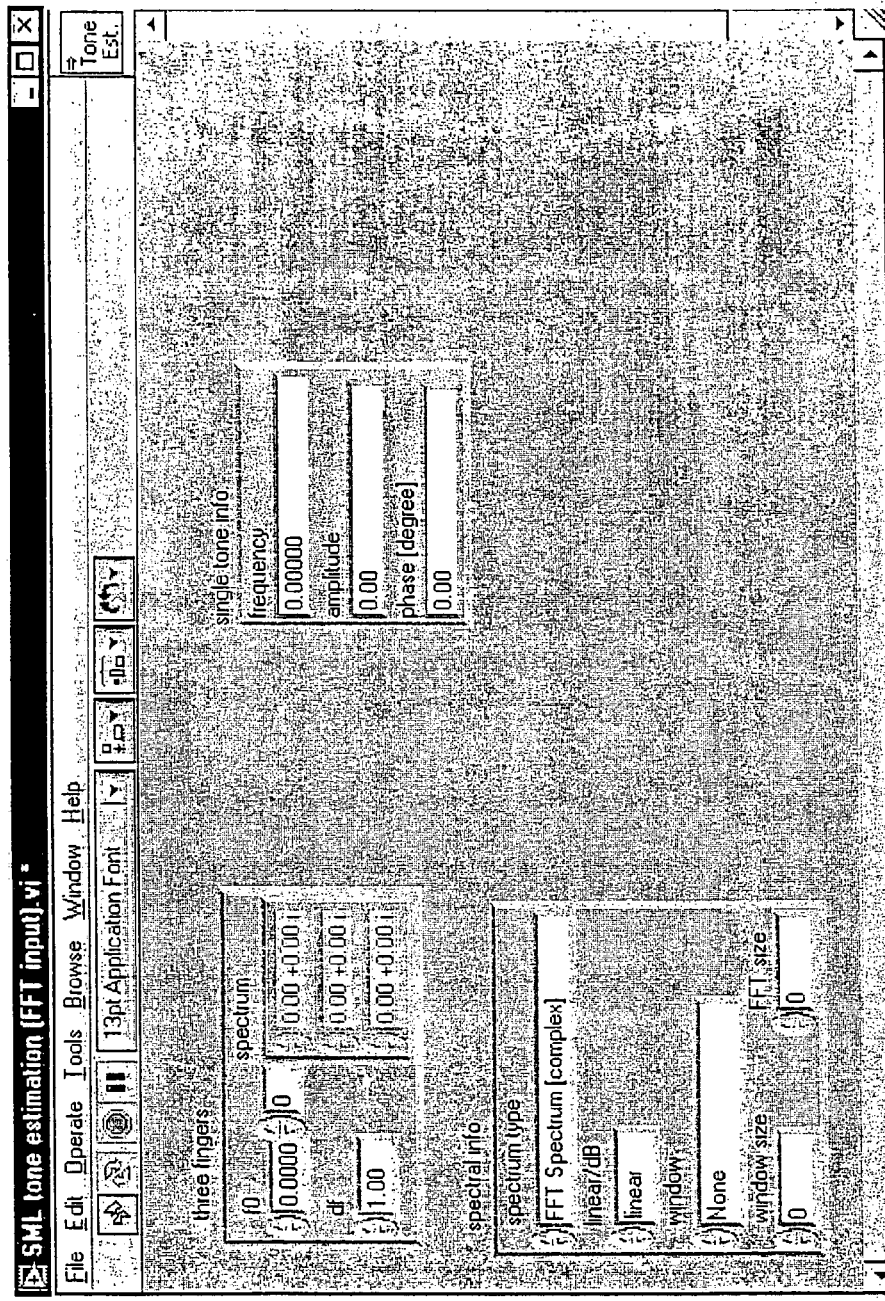
Figure 9B:
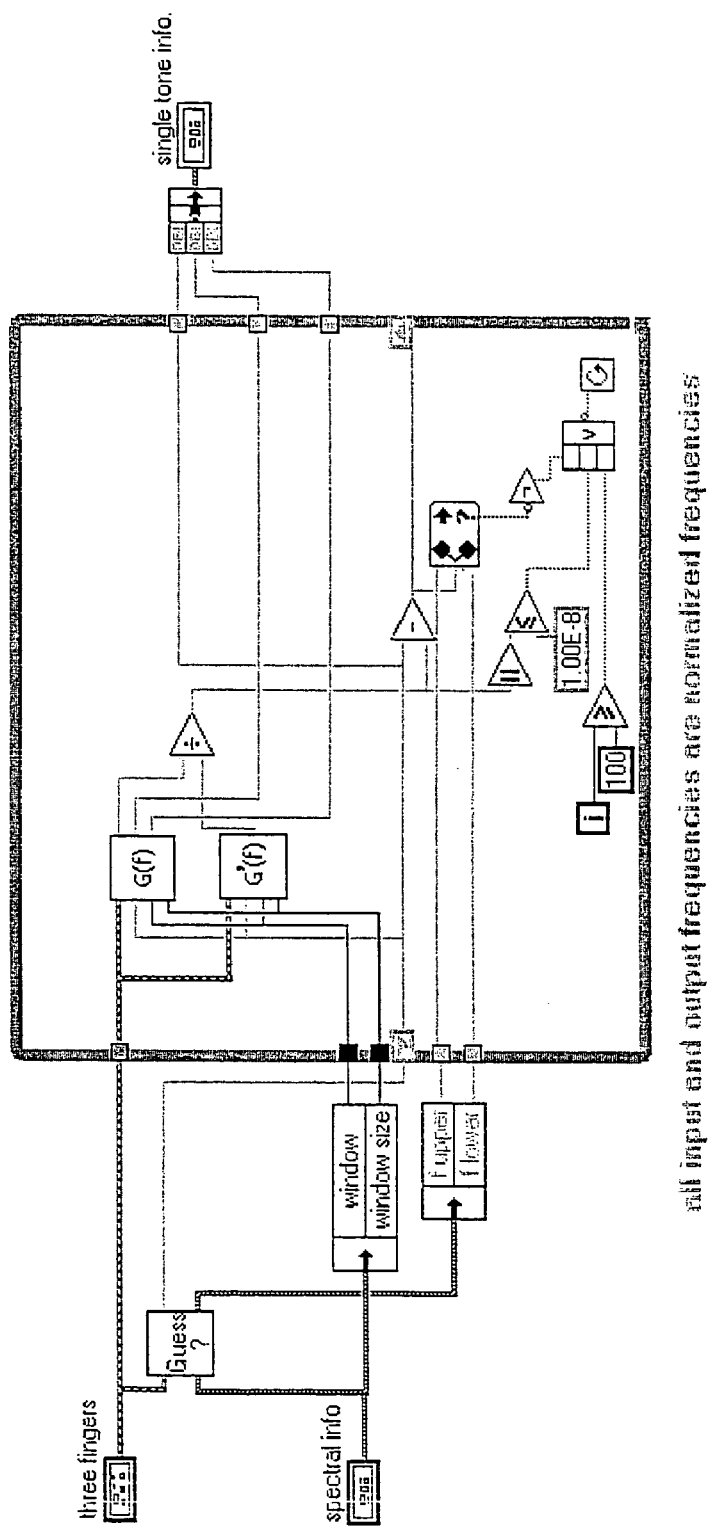

FIGS. 9A and 9B illustrate a front panel and block diagram, respectively, of the graphical program block titled "SML tone estimation (FFT input)" contained in the diagram of FIG. 7B. This graphical program performs the single tone estimation method on the modified or compensated frequency response data of a tone, and includes two blocks labeled "G(f)" and "G'(f)", whose front panels and block diagrams are shown in FIGS. 17A and 17B, and FIGS. 18A and 18B, respectively, and described below.

Figure 10:
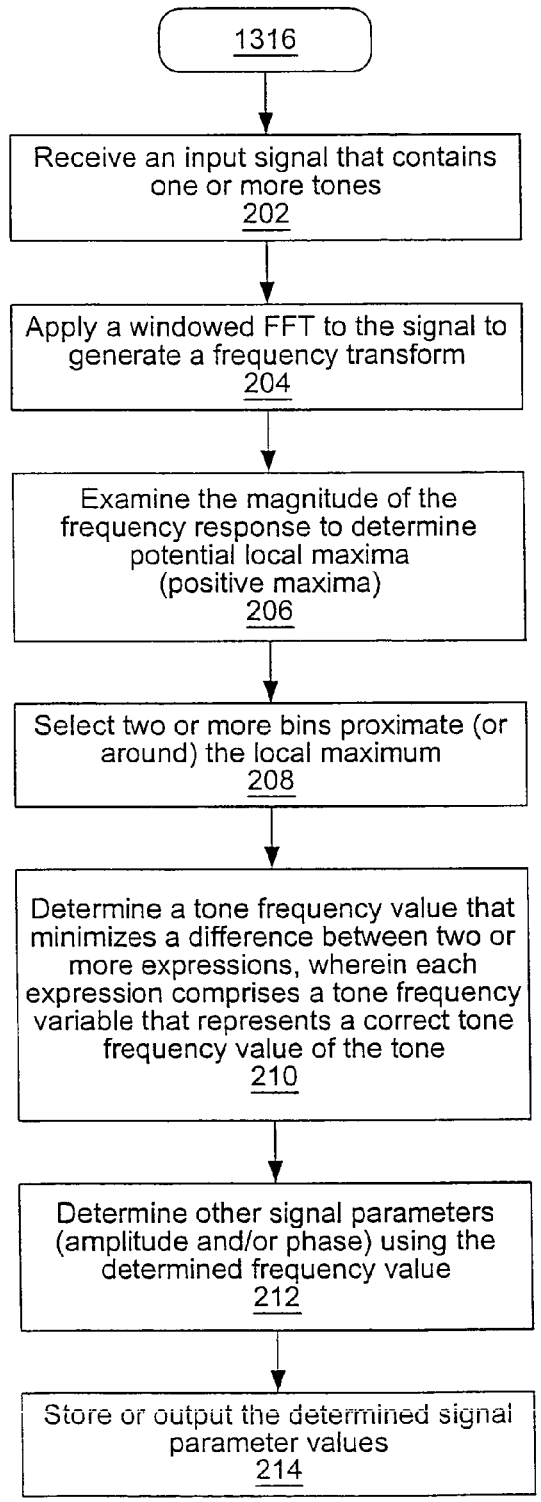
FIG. 10 presents a flowchart for one embodiment of a single tone detection method according to the present invention.

FIG. 10—Determining Signal Parameters of a Tone

FIG. 10 illustrates one embodiment of a method for performing single tone estimation of one or more signal parameters, e.g., one or more of the frequency, amplitude and/or phase, of a tone present in the input signal. In particular, the method illustrated in FIG. 10 is preferably used to perform the single tone estimation referred to in 1316 of FIGS. 4 and 5 above. In one aspect, the method may be referred to as an aliasing compensation method for compensating for the effects of the negative image of a tone on the positive image of the tone. In another aspect, the method may be used to more correctly identify signal parameters of a tone in a signal, compensating for the effects of the negative image of the tone present in the signal.

The method of FIG. 10 may be implemented by execution of a computer program stored on the memory medium as described above. The method may also be implemented in programmable logic, such as an FPGA. The method may also be implemented by a combination of hardware and software, as desired. It is noted that various steps may be performed concurrently or in a different order than that shown, and/or some steps may possibly be omitted, as desired. For example, when the method of FIG. 10 is used for the single tone estimation in step 1316 of the methods of FIGS. 4 and 5, the steps 202 and 204 below may already have been performed, and so may be omitted.

In step 202 the method may receive samples x(n) of the input signal, wherein the input signal includes the tone (or multiple tones). The samples x(n) may be provided by the SRD or may be received from a memory medium, e.g., having been previously recorded/captured from the SRD. Alternatively, the input signal samples may be simulated samples generated by a simulator (e.g. a CPU executing simulation code). Various embodiments of the invention contemplate a wide variety of possible sources for the input signal samples x(n).

The input signal may comprise a single sinusoidal tone in the presence of noise. Thus, the input signal and/or the tone may be modeled by the expression:

$$x(n)=A_i \cos(2\pi f_i n+\phi_i)$$

Where $A_i$ is the amplitude of the tone, $f_i$ is the normalized frequency of the tone, n is from 0 to N−1, and $\phi_i$ is the initial phase of the tone.

Figure 11:
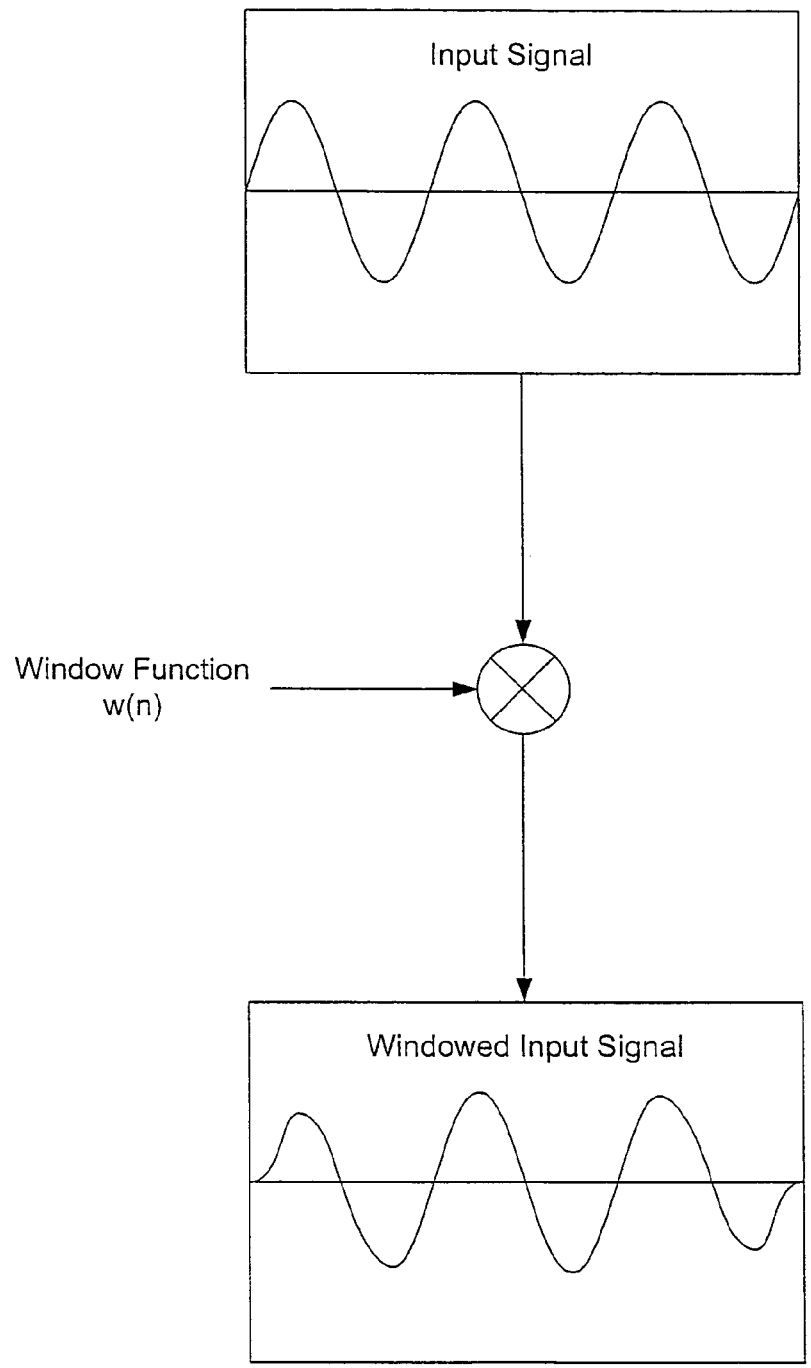
FIG. 11 illustrates a windowing operation being performed on an input signal to generated a windowed input signal.

In step 204 the CPU 140 may multiply the input samples by a known window function w(n) to generate a windowed input signal y(n)=w(n)*x(n) as suggested by FIG. 11. Alternatively, the CPU 140 may receive, e.g., in step 202, a discrete set of samples, which effectively form a windowed version of the signal. The window function w(n) may have any of a variety of forms. For example, the window function may be a rectangular window, a triangular window, a raised cosine window, a Hanning window, etc. The window function may, for example, be any type of cosine window, such as a Hanning, Hamming, Blackman Harris, and Flat Top window, among others.

In step 204, the method may also perform a frequency transform, such as the discrete Fourier transform (DFT), e.g., an FFT (Fast Fourier Transform), on the windowed input signal y(n) to generate a transform array F(n), where n is a frequency bin index which may range from 0 to N−1, or any interval of length N, where N is a positive integer. In one embodiment or one example, the transform array F(n) may be modeled by the transform of the sinusoidal tone, i.e., $$F(n)=A_i e^{-j\phi_i}W(f_n+f_i)+A_i e^{-j\phi_i}W(f_n-f_i)$$

where W(f) represents the Fourier transform of the window w(n). It is noted that the relationship between frequency f and frequency bin number k is given by $$f=f_s*(k/N),$$

where $f_s$ is the sample rate. The magnitude of the window transform W(f) typically has even symmetry and attains a maximum at f=0. Thus, the function W(f−$f_i$) attains a maximum magnitude at frequency f=$f_i$, and the function W(f+$f_i$) attains a maximum magnitude at frequency f=−$f_i$. The first term in the expression above, i.e., $$P(f)=(A/2)\exp(j\,\phi)W(f-f_i),$$

is referred to herein as the "positive-frequency image" since its center frequency occurs at the positive frequency $f_i$. The second term in the expression above, i.e., $$N(f)=(A/2)\exp(-j\,\phi)W(f+f_i)$$

is referred to herein as the "negative-frequency image" since its center frequency occurs at the negative frequency −$f_i$. Thus, the transform array F(n) may include a positive-frequency image and negative-frequency image which combine additively (in the sense of complex addition). The input signal may also include noise, other spurious tones, or other valid tones.

If tone frequency $f_i$ stays away from zero or $f_s/2$, and/or the sample size N is sufficiently large, the overlap between the positive and negative frequency images may be small, and thus, their individual identities may be apparent in the transform array F(n). The magnitude function |F(n)| will thus exhibit two peaks which correspond to the positive and negative frequency images. The frequency locations of one of these peaks (i.e., the peak that occurs in the range of positive frequencies) may be used as an estimate for the tone frequency $f_i$.

Conversely, if the tone frequency is close to zero or $f_s/2$, and/or, the sample size N is sufficiently small, the positive-frequency image and negative frequency image may overlap significantly. Thus, their individual identities may not be apparent in the transform array F(n). In other words, transform array F(n) restricted to positive frequencies may be a poor approximation to the positive frequency image. Thus, the frequency location at which the magnitude function |F(n)| attains a maximum, when considered over positive frequencies, may only be a crude initial approximation to the tone frequency $f_i$.

Figure 12:
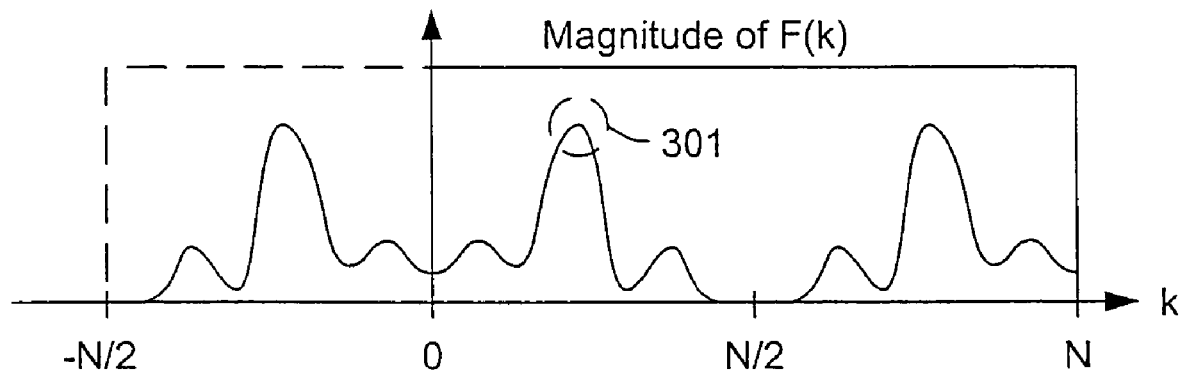
FIG. 12 illustrates the magnitude of transform array F(k) for a typical windowed input signal comprising a single sinusoidal tone.

FIG. 12 is a plot of the magnitude of transform F(n) corresponding to a typical windowed input signal x(n), similar to that described above with reference to FIG. 3. Note that the transform F(n) has a symmetry given by F(n)=F(k+N) for any integer k. In particular, F(−k)=F(N−k). Thus, frequency bin numbers between N/2 and N may be interpreted as negative frequencies.

In step 206, method may identify a frequency location proximate to an amplitude peak in the frequency transform, wherein the amplitude peak may correspond to the tone. For example, in step 206 the method may determine the maximum amplitude peak in the input signal, which is presumed to be the peak of the tone. In one embodiment, the method may scan the DFT magnitude values |F(n)| over the range of positive frequency bins to determine the potential local positive maximum amplitude, e.g., to determine the bin index k which achieves the maximum magnitude. Where multiple tones are present in the input signal, the method may find multiple amplitude peaks and select one for subsequent processing.

In step 208 the method may select two or more frequency bins proximate to the identified frequency location in the frequency transform. Thus the method may select two or more bins proximate to (or around) the positive maximum determined in 206. The method preferably selects frequency bins located on either side of the frequency location of the amplitude peak. In other words, at least one of the two or more frequency bins is on each side of the frequency location, i.e., one or more bins on a first side of the frequency location of the amplitude peak and one or more bins on the other side of the frequency location of the amplitude peak. In one embodiment, in step 208 the method may select several bins k that are in the neighborhood of $k_{max}$, wherein $k_{max}$ is the integer bin index value k in the range from 0 to N/2 which maximizes the magnitude of F(n).

Figure 13:
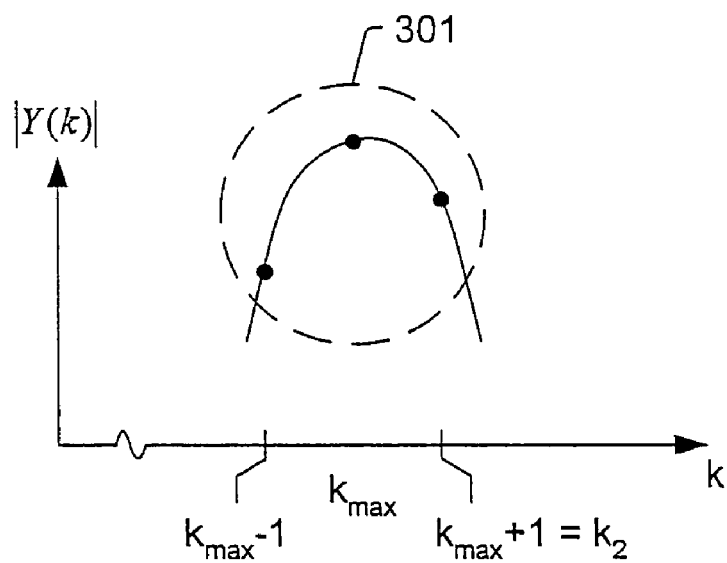
FIG. 13 illustrates a blowup of a generic magnitude peak from the magnitude spectrum of FIG. 12.

As noted above, the maximum of magnitude function |F(n)| considered as a function of continuous frequency typically does not occur at the integer value $k_{max}$, but should occur in the interval between $k_{max}$ and the next highest amplitude sample frequency, $k_2$. FIG. 13 illustrates a blowup of the positive frequency magnitude peak 301 proximate to bin index value $k_{max}$. In this example, the method may select $k_{max}$−1 and $k_{max}$+1 as the bins proximate to the frequency producing the positive maximum amplitude. In this embodiment, the method selects three frequency bins for processing. However, the method may select 2, 3, 4, or a greater number of bins, as desired.

In step 210 the method may determine a tone frequency value that minimizes a difference between two or more expressions, e.g., at least a first expression and a second expression. Stated another way, the method may involve selecting a tone frequency value that makes a plurality of expressions most nearly equal.

Each of the plurality of expressions may comprise a sum of one or more numerator terms divided by a sum of one or more denominator terms, wherein each of the plurality of expressions includes a tone frequency variable, wherein each numerator term and each denominator term corresponds to one of the frequency bins, and wherein a ratio of each numerator term and its corresponding denominator term represent a complex amplitude of the tone at a respective bin.

Thus, for example, the first expression may comprise a sum of two or more numerator terms divided by a sum of two or more denominator terms, wherein the first expression includes a tone frequency variable. In a similar manner, the second expression may comprise a sum of one or more of the numerator terms divided by a sum of one or more of the denominator terms, wherein the second expression includes the tone frequency variable. The number of numerator terms and corresponding denominator terms in the first expression are preferably different than the number of numerator terms and corresponding denominator terms in the second expression.

In each expression, each numerator term and its corresponding denominator term correspond to one of the frequency bins. In one embodiment, a ratio of each numerator term and its corresponding denominator term represent a complex amplitude of the tone at a respective bin. In each expression, the tone frequency variable may represent a correct tone frequency value of the tone. The first expression may be approximately equivalent to the second expression when the correct tone frequency value is used for the tone frequency variable in the first and second expressions.

As one example of the expressions used, where two frequency bins are selected, the first expression may comprise a sum of two numerator terms divided by a sum of the corresponding two denominator terms, wherein the two numerator terms and the two denominator terms correspond to the two frequency bins. The second expression may comprise one numerator term divided by one corresponding denominator term corresponding to one of the two frequency bins.

As another example, where three frequency bins are selected, the first expression may comprise a sum of three numerator terms divided by a sum of the corresponding three denominator terms, wherein the three numerator terms and the three denominator terms correspond to the three frequency bins. The second expression may comprise a sum of two of the three numerator terms divided by a sum of two of the three corresponding denominator terms, corresponding to two of the three frequency bins.

The step of determining a tone frequency value may comprise computing a plurality of differences between the first expression and the second expression for different respective tone frequency values of the tone frequency variable, and then selecting the tone frequency value that produces a smallest difference. The method may compute the plurality of differences by performing a Newton-Rhapson root finding method, as is known in the art.

The expressions may be real expressions or complex expressions. Where the expressions are complex expressions, the method may involve minimizing a difference between an amplitude of the first complex expression and an amplitude of the second complex expression.

In one embodiment, the first expression and the second expression have the form:

$$\left| \frac{\sum_{k+1}^{k+M} (F(n)W^*(f_n - f_i) - F^*(n)W(f_n + f_i))}{\sum_{k+1}^{k+M} (|W(f_n - f_i)|^2 - |W(f_n + f_i)|^2)} \right| =$$

$$\left| \frac{\sum_{k+1}^{k+M-1} (F(n)W^*(f_n - f_i) - F^*(n)W(f_n + f_i))}{\sum_{k+1}^{k+M-1} (|W(f_n - f_i)|^2 - |W(f_n + f_i)|^2)} \right|$$

wherein:

F(n) is the nth value of the single sided scaled FFT spectrum; and

W represents a window function, wherein the window function is shifted by a value of the tone frequency variable $f_i$.

Introducing the function G(f):

$$G(f) = \left| \sum_{k+1}^{k+M} (F(n)W^*(f_n - f) - F^*(n)W(f_n + f)) \right| \times$$

$$\left| \sum_{k+1}^{k+M-1} (|W(f_n - f)|^2 - |W(f_n + f)|^2) \right| -$$

$$\left| \sum_{k+1}^{k+M-1} (F(n)W^*(f_n - f) - F^*(n)W(f_n + f)) \right| \times$$

$$\left| \sum_{k+1}^{k+M} (|W(f_n - f)|^2 - |W(f_n + f)|^2) \right|$$

This results in:

$G(f)=0$

This equation is a function of f, and this equation can be solved by applying Newton Raphson's root finding algorithm to determine the tone frequency $f_i$. The theory behind the use of these expressions is discussed further below.

When the frequency transform of the samples computed in 204 comprises generating a power spectrum of the samples, the first expression and the second expression have the form:

$$\left| \frac{\sum_{k+1}^{k+M} (|F(n)| \times |W(f_n - f_i)|)}{\sum_{k+1}^{k+M} |W(f_n - f_i)|^2} \right| = \left| \frac{\sum_{k+1}^{k+M-1} (|F(n)| \times |W(f_n - f_i)|)}{\sum_{k+1}^{k+M-1} |W(f_n - f_i)|^2} \right|$$

wherein:

F(n) is the nth value of the single sided scaled FFT spectrum; and

W represents a window function, wherein the window function is shifted by a value of the tone frequency variable $f_i$.

Let:

$$G(f) = \sum_{k+1}^{k+M} (|F(n)| \times |W(f_n - f)|) \times$$

$$\sum_{k+1}^{k+M-1} |W(f_n - f)|^2 - \sum_{k+1}^{k+M-1} (|F(n)| \times$$

$$|W(f_n - f)|) \times \sum_{k+1}^{k+M} |W(f_n - f)|^2$$

This results in:

$$G(f)=0$$

Again, Newton Raphson root finding may be performed to solve for the frequency of the tone. The theory behind the use of these expressions is discussed further below.

The tone frequency value determined in step 210 may comprise the correct frequency of the tone. As used herein, the term "correct" includes correct or substantially correct. In other words, the determined tone frequency value represents a good approximation of the correct tone frequency value. The method described herein operates to find a more exact approximation of the frequency of the tone, even in the presence of noise or interference from other tones (i.e., the positive and/or negative images from other tones), or the negative image of the respective tone being found. The method is also more computationally efficient than prior art techniques.

Where the input signal comprises a plurality of tones, the method may operate to correctly find signal parameters of a first tone of the plurality of tones. Where it is desired to locate two or more of, or all of, the tones present in the input signal, steps 206–210 may be iteratively performed for each of the plurality of tones to determine at least one signal parameter for each of the plurality of tones in the input signal.

After the tone frequency value has been determined in step 210, in step 212 the method may then optionally compute one or more of the amplitude and phase of the tone using the determined tone frequency value. For example, wherein the FFT spectrum is available, once the $f_i$ value is known, the amplitude and phase can be computed as:

$$A_i e^{j\varphi_i} = C = \frac{\sum_{k+1}^{k+M} (F(n)W^*(f_n - f_i) - F^*(n)W(f_n + f_i))}{\sum_{k+1}^{k+M} (|W(f_n - f_i)|^2 - |W(f_n + f_i)|^2)}$$

Where the FFT power spectrum is available, once the frequency is known, the amplitude can be computed as:

$$A_i = \left| \frac{\sum_{k+1}^{k+M} (|F(n)| \times |W(f_n - f_i)|)}{\sum_{k+1}^{k+M} |W(f_n - f_i)|^2} \right|$$

In step 214 the method may then comprise storing the determined tone frequency value, as well as the amplitude and/or phase if these are computed, in a memory, or outputting the determined tone frequency value, amplitude and/or phase, e.g., on a display.

Theory of Operation of the Expressions

The following describes the derivation and theory behind the expressions used in the preferred embodiment.

As noted above, given a single tone signal in the time domain, the input signal comprising the tone can be expressed in following form:

$$x(n)=A_i \cos(2\pi f_i n+\phi_i) \quad (1)$$

Where $A_i$ is the amplitude, $f_i$ is the normalized frequency, n is from 0 to N−1 and $\phi_i$ is the initial phase. Here the subscript "i" is used to represent a single tone in what could be a multitone signal.

If the FFT is computed based on the windowed version of x(n) as performed in step 204, then in the frequency domain, as noted above, each FFT bin can be computed as follows:

$$F(n)=A_i e^{-j\phi_i}W(f_n+f_i)+A_i e^{j\phi_i}W(f_n-f_i) \quad (2)$$

In the above equation, the first term of the equation represents the negative image of the tone and the second term represents the positive image of the tone.

Each equation can then be converted to a different form. For example, given the following:

$$C=A_i e^{j\phi_i} \quad (3)$$

Then $$F(n)=C^*W(f_n+f_i)+CW(f_n-f_i) \quad (4)$$

Here, F(n) is the nth value of the single sided scaled FFT spectrum.

The windowed frequency response can be easily computed numerically once the window coefficients are known.

Estimate Amplitude/Frequency/Phase Based on FFT Spectrum

If the FFT spectrum is available, each particular single tone can be roughly determined by finding the local maximum in the sense of amplitude. Here assume F(k+1), F(k+2), . . . F(k+M) are the M bins around the single tone. This results in a set of nonlinear equations of:

$$F(n)=C^*W(f_n+f_i)+CW(f_n-f_i) \quad (5)$$

Where n=k+1, k+2, . . . k+M;

From this point, the following equation can be derived:

$$C = \frac{F(n)W^*(f_n - f_i) - F^*(n)W(f_n + f_i)}{|W(f_n - f_i)|^2 - |W(f_n + f_i)|^2} \quad (6)$$

For each n=k+1, . . . k+M.

Furthermore, to reduce the numerical fluctuation, the equation (7) may be written as follows:

$$\left| \frac{\sum_{k+1}^{k+M} (F(n)W^*(f_n - f_i) - F^*(n)W(f_n + f_i))}{\sum_{k+1}^{k+M} (|W(f_n - f_i)|^2 - |W(f_n + f_i)|^2)} \right| =$$

$$\left| \frac{\sum_{k+1}^{k+M-1} (F(n)W^*(f_n - f_i) - F^*(n)W(f_n + f_i))}{\sum_{k+1}^{k+M-1} (|W(f_n - f_i)|^2 - |W(f_n + f_i)|^2)} \right|$$

This equation is a function of $f_i$, and this equation may be solved in step 210 by applying Newton Raphson's root finding algorithm.

Define $G(f)$:

$$G(f) = \left| \sum_{k+1}^{k+M} (F(n)W^*(f_n - f) - F^*(n)W(f_n + f)) \right| \times \quad (8)$$

$$\left| \sum_{k+1}^{k+M-1} (|W(f_n - f)|^2 - |W(f_n + f)|^2) \right| -$$

$$\left| \sum_{k+1}^{k+M-1} (F(n)W^*(f_n - f) - F^*(n)W(f_n + f)) \right| \times$$

$$\left| \sum_{k+1}^{k+M} (W(f_n - f)|^2 - |W(f_n + f)|^2) \right|$$

Now by solving the equation:

$$G(f) = 0 \quad (9)$$

using Newton Raphson's root finding algorithm (or other suitable root find methods), the tone frequency $f_i$ can be determined Once the $f_i$ value is known, the amplitude and phase can be computed as follows:

$$A_i e^{j\varphi_i} = C = \frac{\sum_{k+1}^{k+M} (F(n)W^*(f_n - f_i) - F^*(n)W(f_n + f_i))}{\sum_{k+1}^{k+M} (|W(f_n - f_i)|^2 - |W(f_n + f_i)|^2)} \quad (10)$$

Estimate Amplitude/Frequency Based on FFT Power Spectrum

If the FFT power spectrum is available, then the amplitude and frequency of the tone may be estimated based on the FFT power spectrum. Since the phase information is not available in the power spectrum, the effect of the negative frequency cannot be taken into account. The equation for computing the frequency are as follows:

$$\left| \frac{\sum_{k+1}^{k+M} (|F(n)| \times |W(f_n - f_i)|)}{\sum_{k+1}^{k+M} |W(f_n - f_i)|^2} \right| = \left| \frac{\sum_{k+1}^{k+M-1} (|F(n)| \times |W(f_n - f_i)|)}{\sum_{k+1}^{k+M-1} |W(f_n - f_i)|^2} \right| \quad (11)$$

Let equation (12) be:

$$G(f) = \sum_{k+1}^{k+M} (|F(n)| \times |W(f_n - f)|) \times \sum_{k+1}^{k+M-1} |W(f_n - f)|^2 -$$

$$\sum_{k+1}^{k+M-1} (|F(n)| \times |W(f_n - f)|) \times \sum_{k+1}^{k+M} |W(f_n - f)|^2$$

This results in equation (13):

$$G(f) = 0$$

Again, the Newton-Raphson root finding method may be applied to solve for the frequency of the tone.

Once the frequency is known, the amplitude can be computed by equation (13) as:

$$A_i = \left| \frac{\sum_{k+1}^{k+M} (|F(n)| \times |W(f_n - f_i)|)}{\sum_{k+1}^{k+M} |W(f_n - f_i)|^2} \right| \quad (14)$$

In one embodiment, the power spectrum may be averaged before applying this tone estimation. The measurement is more stable when using the averaged power spectrum.

Thus, the above single tone estimation method may be used to find and characterize a tone in a received signal. Additionally, the method may be used to detect and characterize a plurality of different tones present within a signal by applying the method iteratively to find each respective tone within the input signal. As described above, in one embodiment, as each tone is determined or found, the determined tone may be subtracted out from the input signal to produce a modified input signal, and the method may be then performed on the modified input signal to locate the next tone, and so on.

It is noted that although the single tone estimation method described above (or variants thereof) is preferably used in the present invention, other single tone estimation methods are also contemplated, such as that described in U.S. patent application Ser. No. 09/753,164, titled "System and Method for Estimating Tones in an Input Signal", which is incorporated by reference above.

Applications

Embodiments of the present invention may be used in various applications. In general, embodiments of the present invention may be used in any system where it is desired to detect tones, e.g., sinusoidal tones, present in a signal, e.g., where it is desired to detect the precise frequency, amplitude and/or phase of the tones present in the signal. For example, an embodiment of the present invention may be used in a DTMF (Dual Tone Multi-Frequency) system for detecting tones present in a signal, such as a signal generated by a keypad of a telephone. Embodiments of the present invention are also contemplated for use in applications involving sonar, radar (e.g. Doppler radar), frequency-shift keying applications, mechanical systems analysis, etc. For example, the reflections generated by multiple moving objects in response to a radar pulse have distinct frequencies dependent on their radial velocities with respect to the radar station. Thus, the frequencies of the reflections are usable for tracking the multiple moving objects. In another example, a mechanical system excited with a physical stimulus (e.g. an impulse) may manifest vibrations at one or more frequencies. The frequency, amplitude and/or phase of these vibrations may provide information to a system analyst about the nature of flaws in the mechanical system. Embodiments of the present invention may be used in a wide variety of applications, i.e. in any application where it is desirable to identify one or more tones present in an input signal. The above-mentioned applications are merely representative examples.

Example Graphical Program for Single Tone Detection

FIGS. 14A–18B comprise screen shots of a portion of a graphical program which implements one embodiment of the invention. FIGS. 14A–18B comprise screen shots of a portion of a graphical program or Virtual Instrument (VI) written in the LabVIEW graphical programming language. The graphical program is hierarchical in nature, where FIGS. 14A and 14B comprise the top level front panel and block diagram, and FIGS. 15A/B, 16A/B, 17A/B, and 18A/B are various sub programs or sub-VIs of the program. Various other sub programs or sub-VIs of this graphical program that are not necessary to an understanding of this embodiment of the invention are not included for convenience.

Figure 14A:
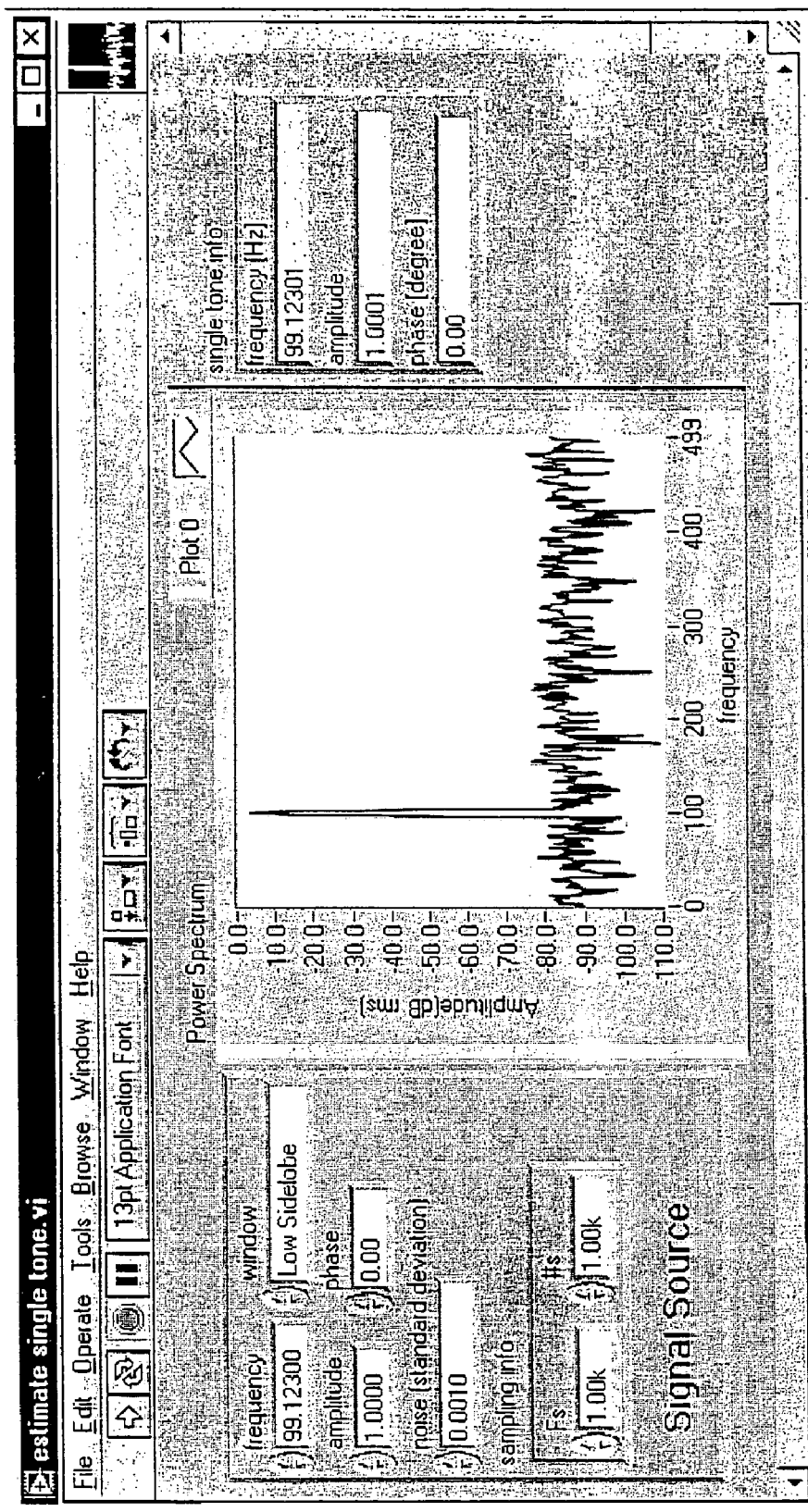
FIGS. 14A and 14B, 15A and 15B, 16A and 16B, 17A and 17B, and 18A and 18B illustrate front panels and block diagrams of a portion of a graphical program that implements one embodiment of the invention.
Figure 14B:
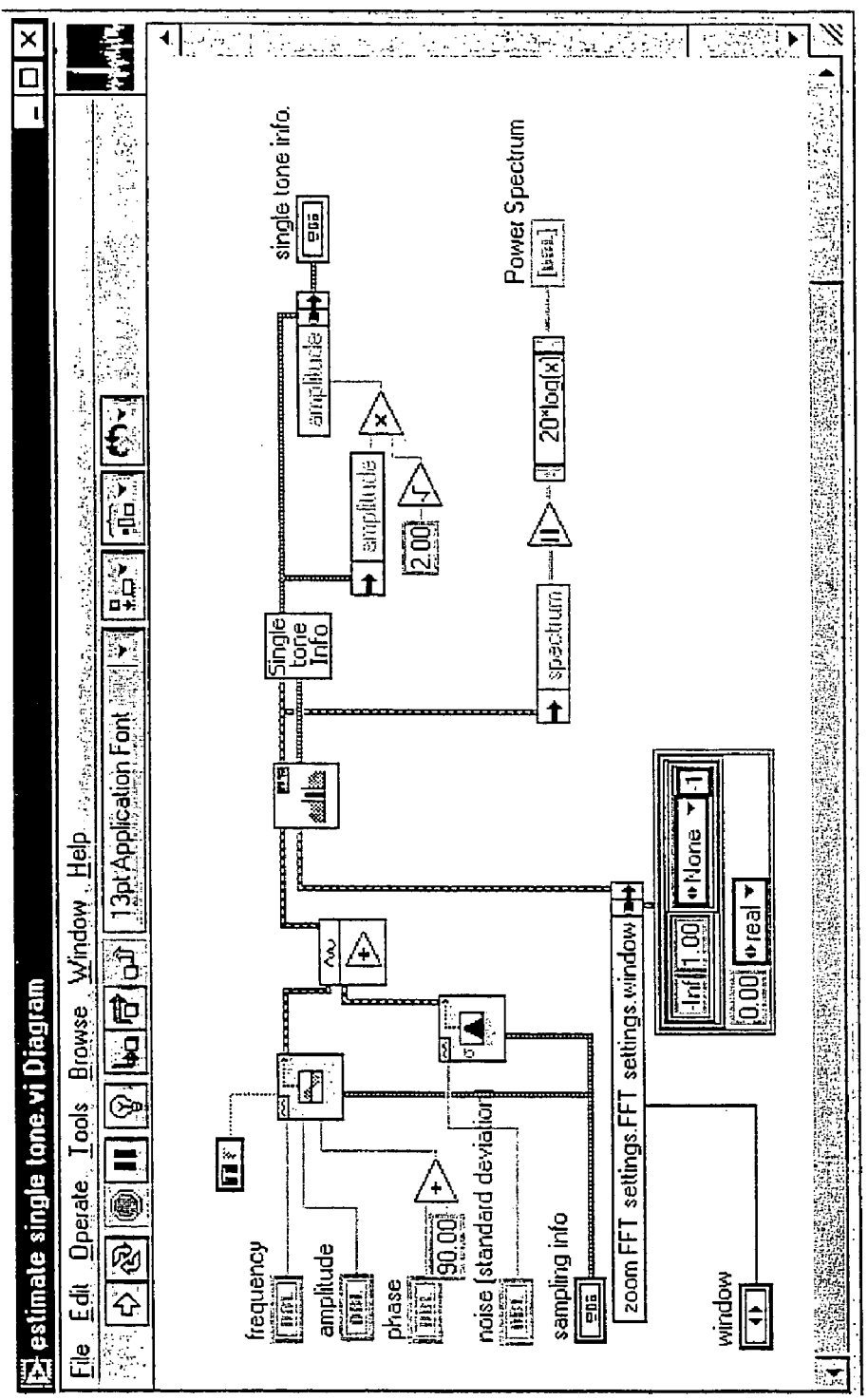

FIGS. 14A and 14B illustrate a top level front panel and block diagram, respectively, of the graphical program titled "estimate single tone". This graphical program includes a block titled "single tone info" ("single tone information").

Figure 15A:
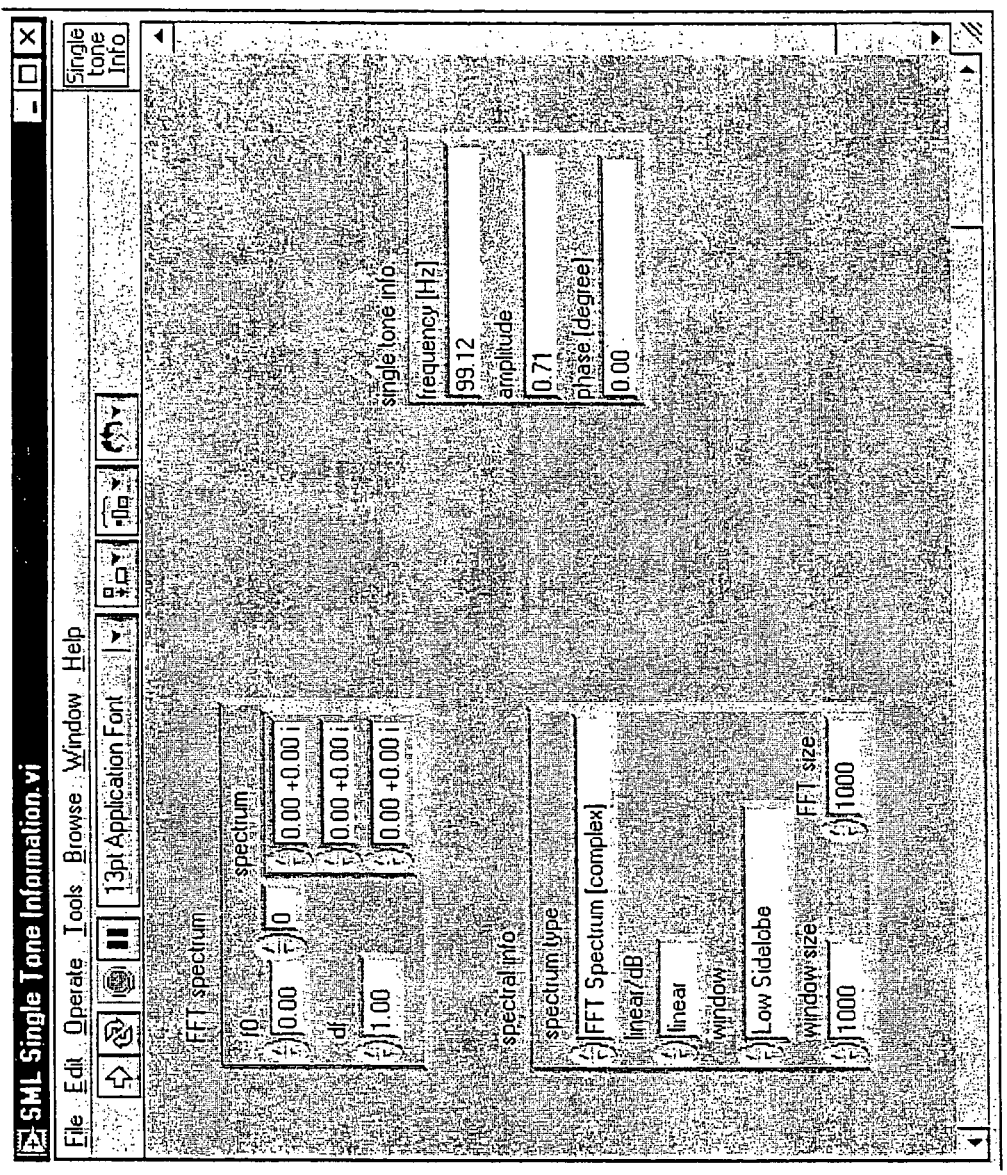
Figure 15B:
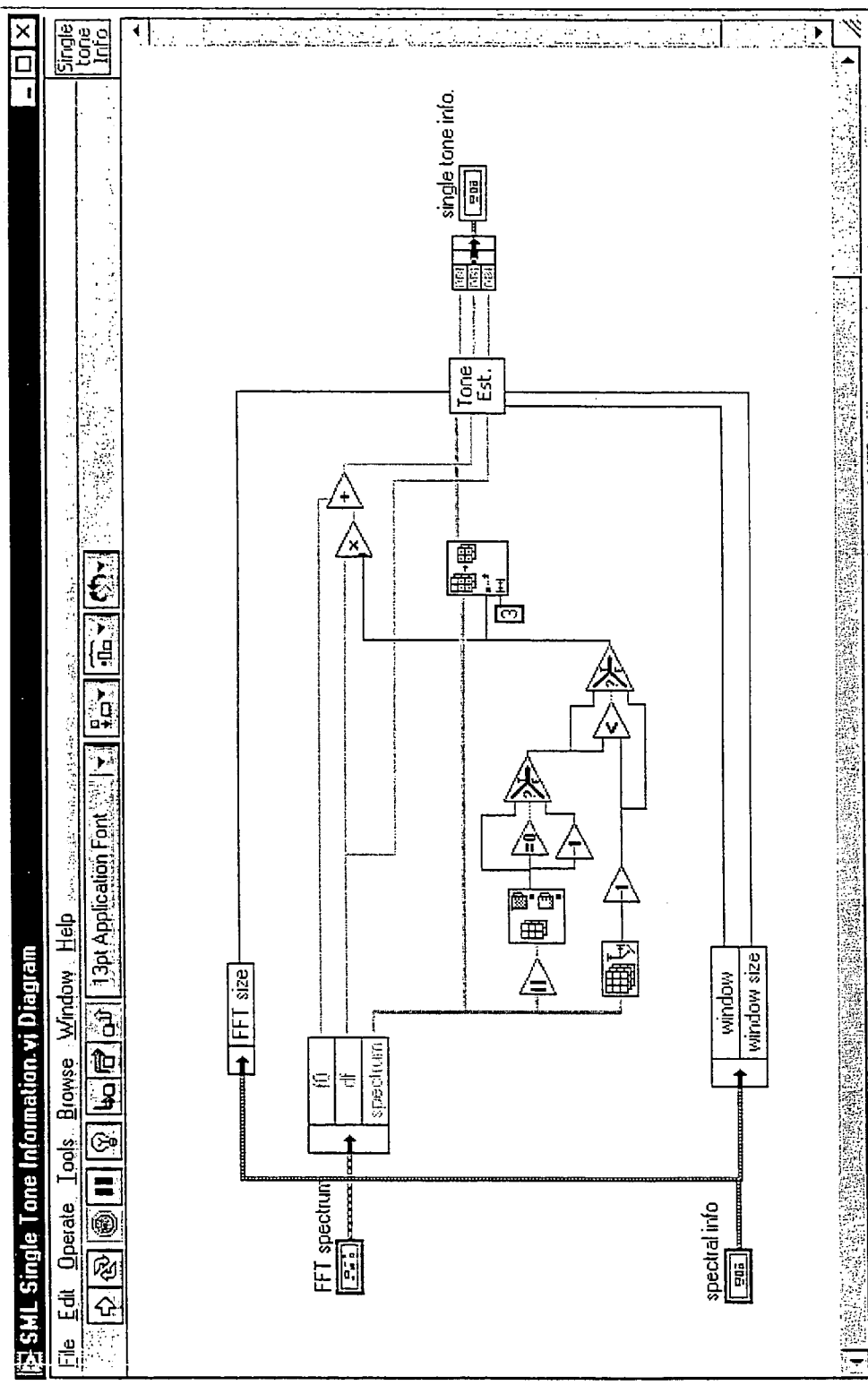

FIGS. 15A and 15B illustrate a front panel and block diagram, respectively, of the graphical program block titled "single tone information" contained in the diagram of FIG. 7B. This graphical program includes a block titled "tone est." ("tone estimation").

Figure 16A:
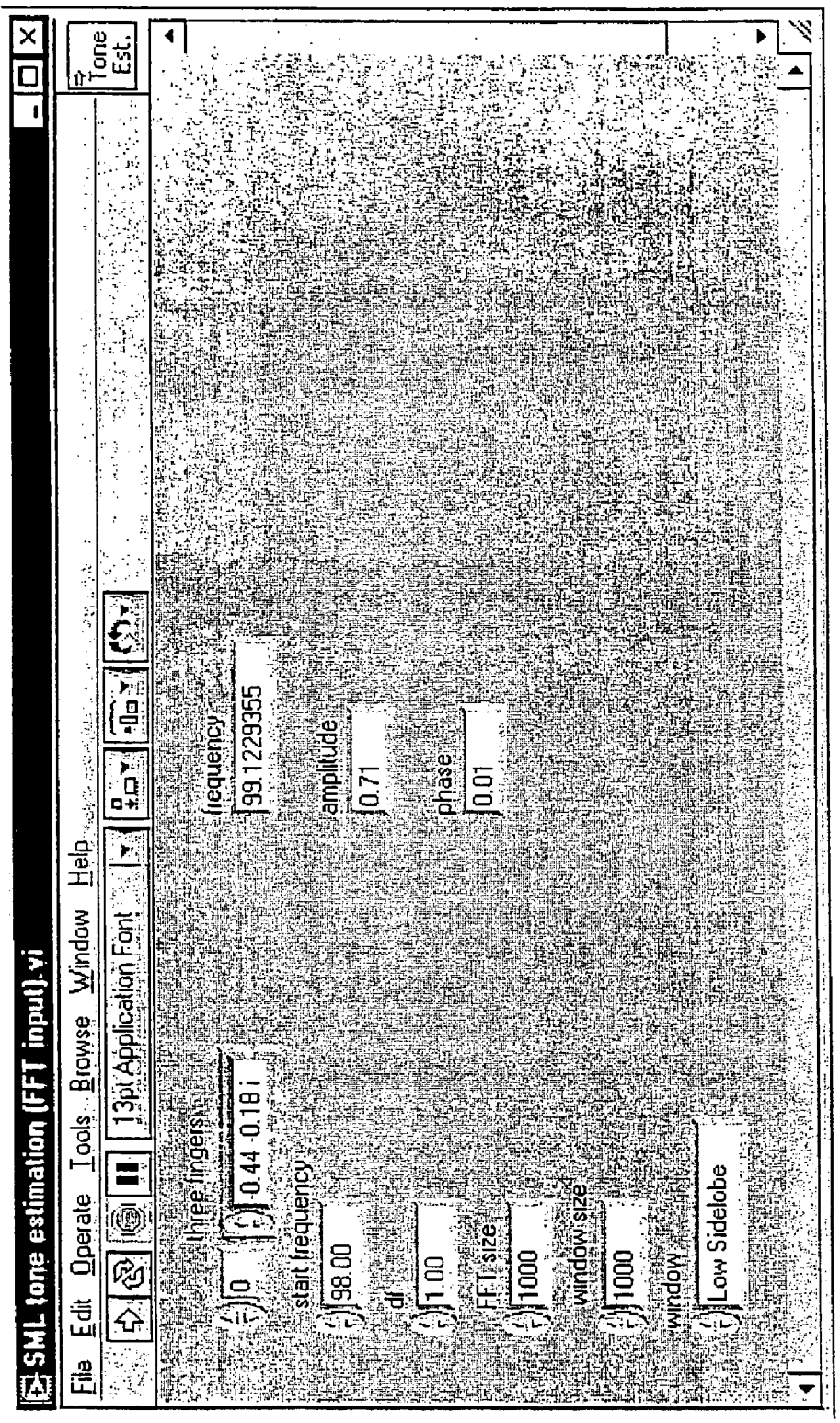
Figure 16B:
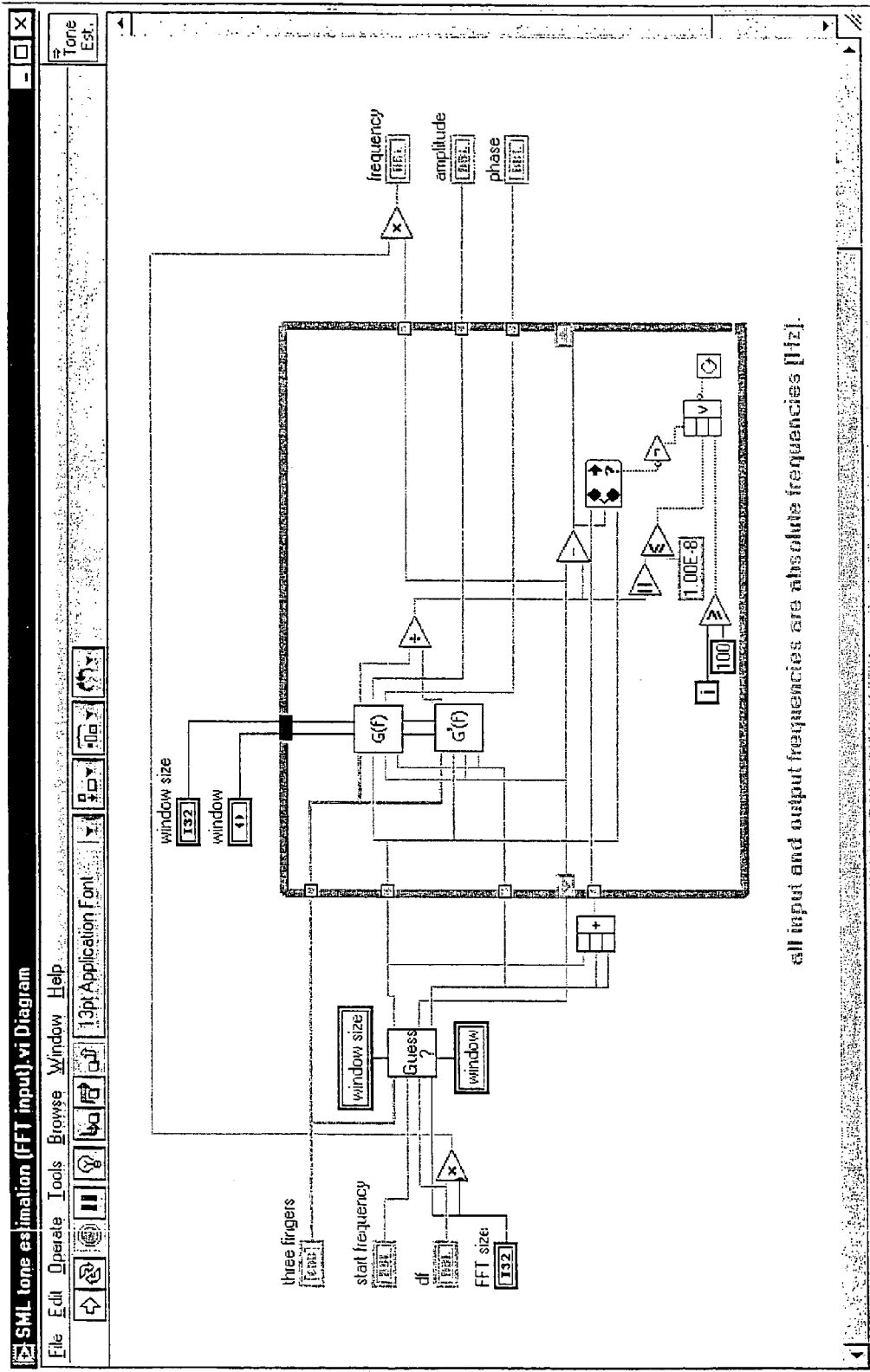

FIGS. 16A and 16B illustrate a front panel and block diagram, respectively, of the graphical program block titled "tone estimation" contained in the diagram of FIG. 8B. This graphical program includes two blocks labeled "G(f)" and "G'(f)", which are used to compute the signal parameters characterizing a tone, as described above.

Figure 17A:
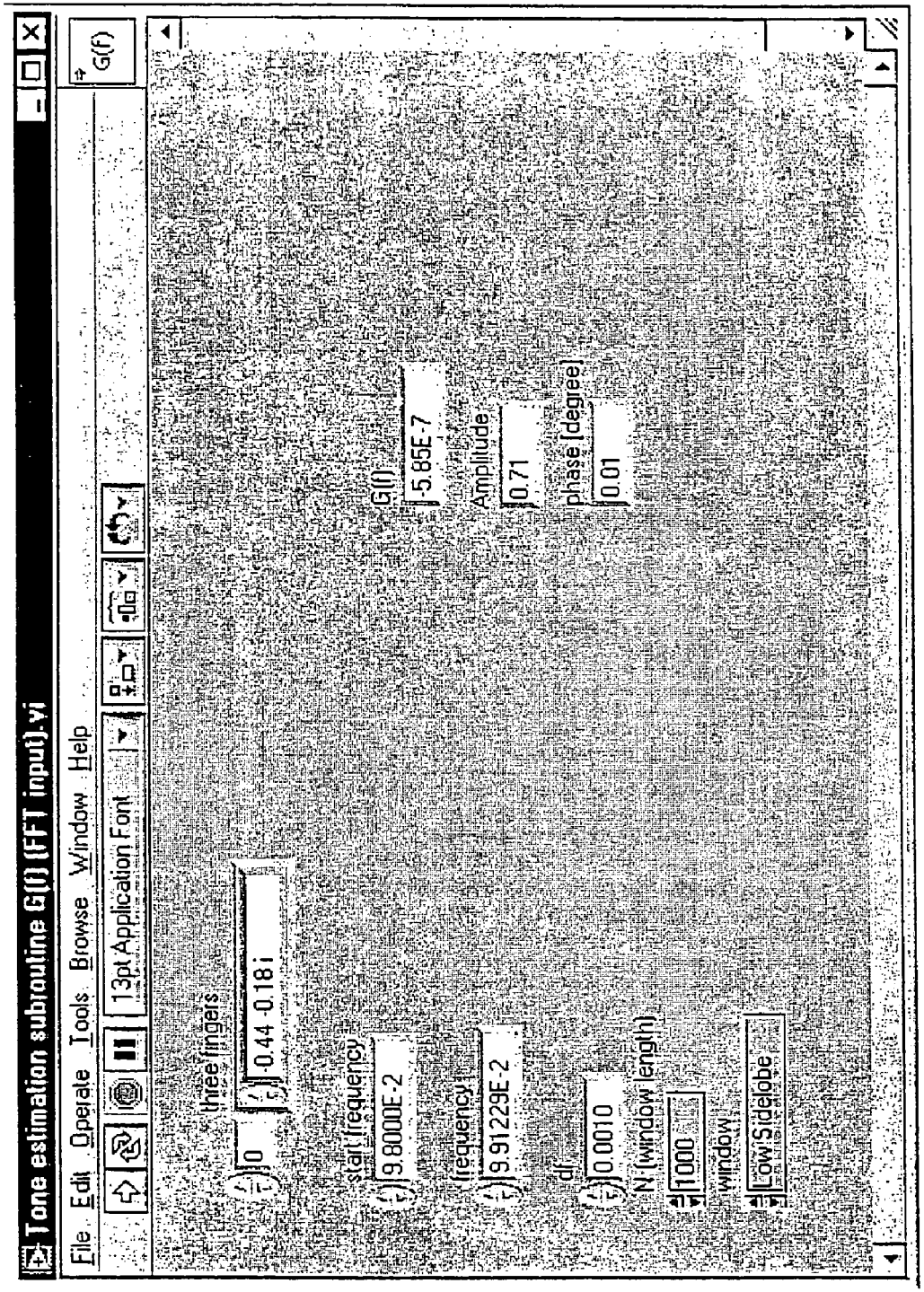
Figure 17B:
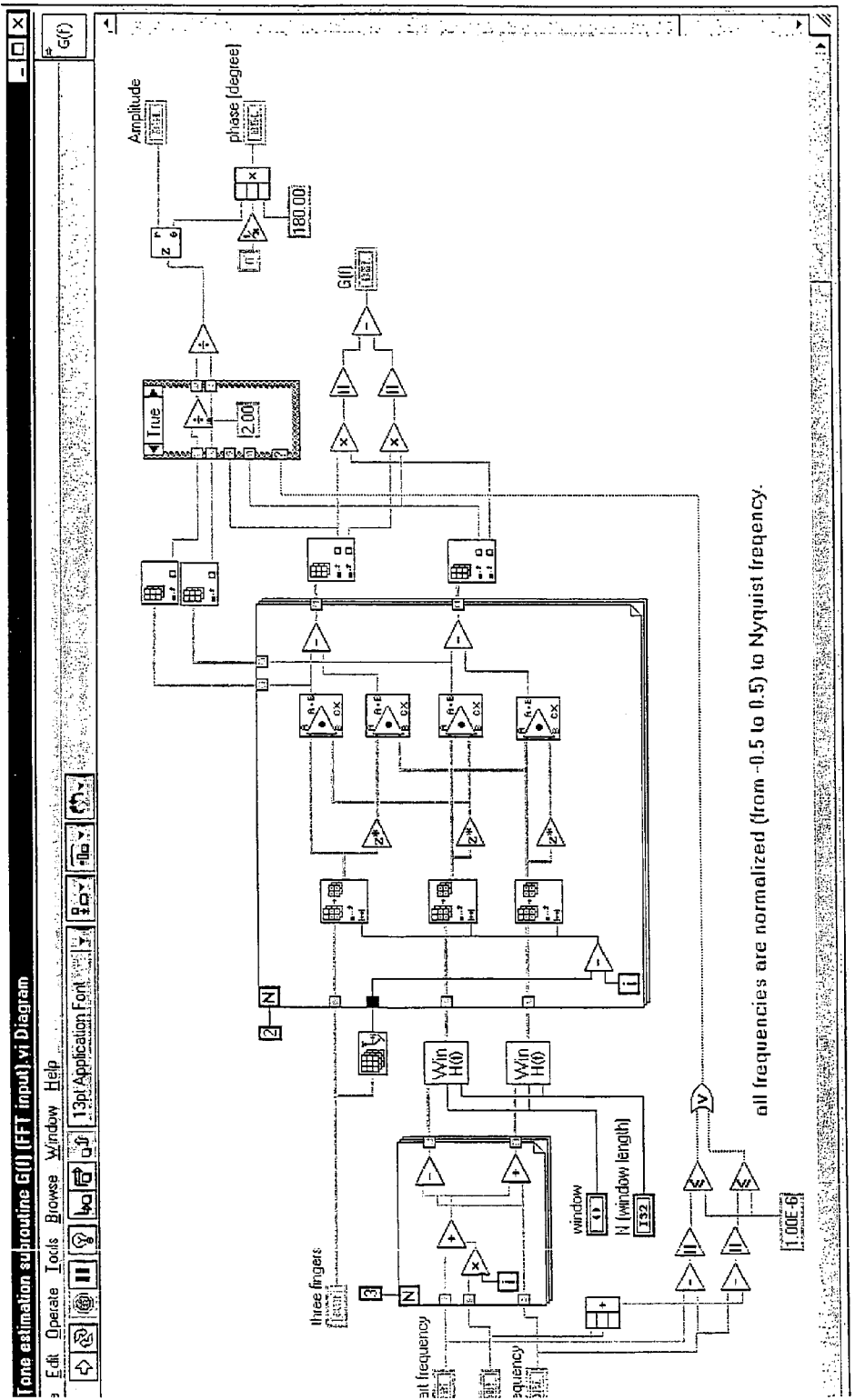

FIGS. 17A and 17B illustrate a front panel and block diagram, respectively, of the graphical program block titled "G(f)".

Figure 18A:
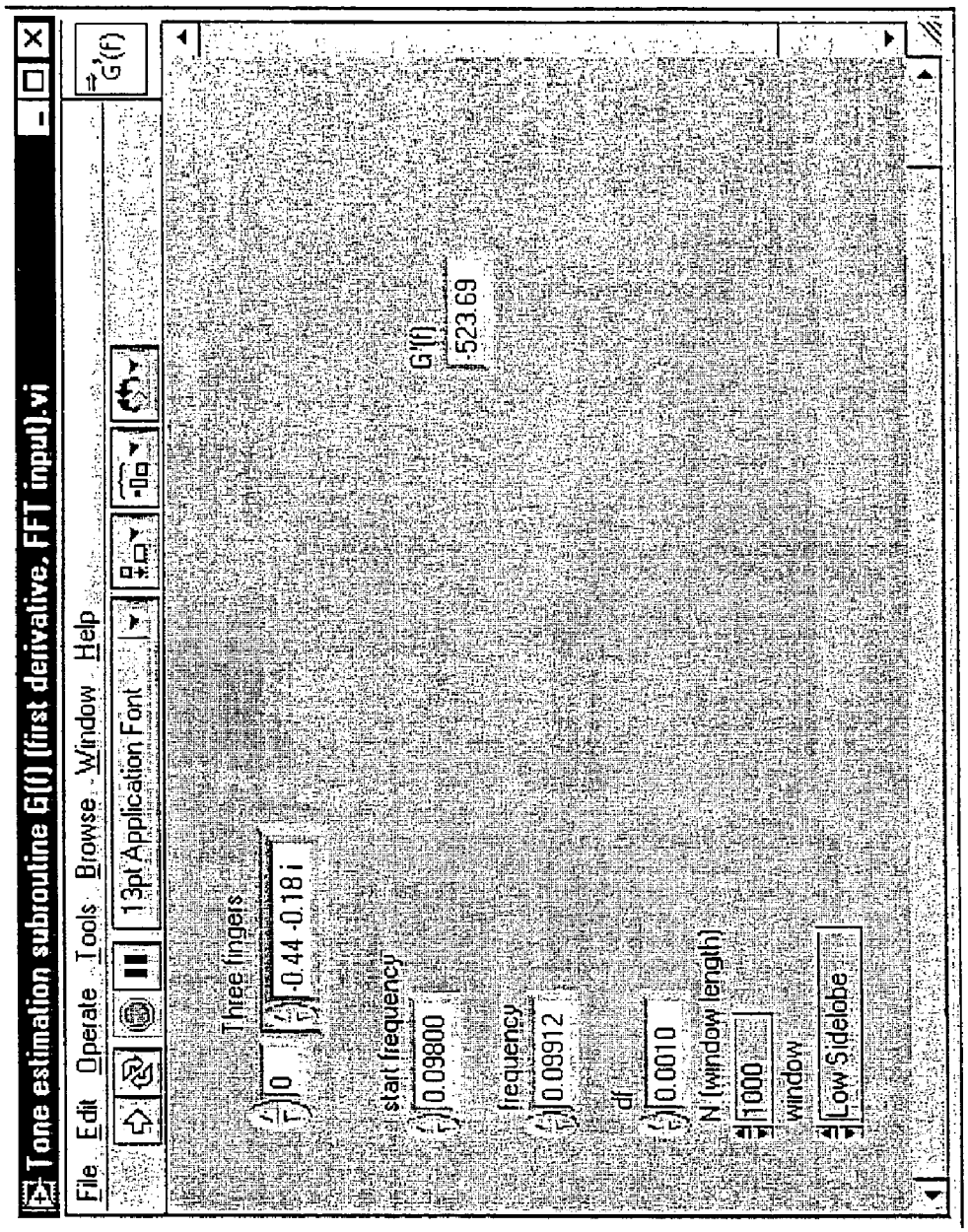
Figure 18B:
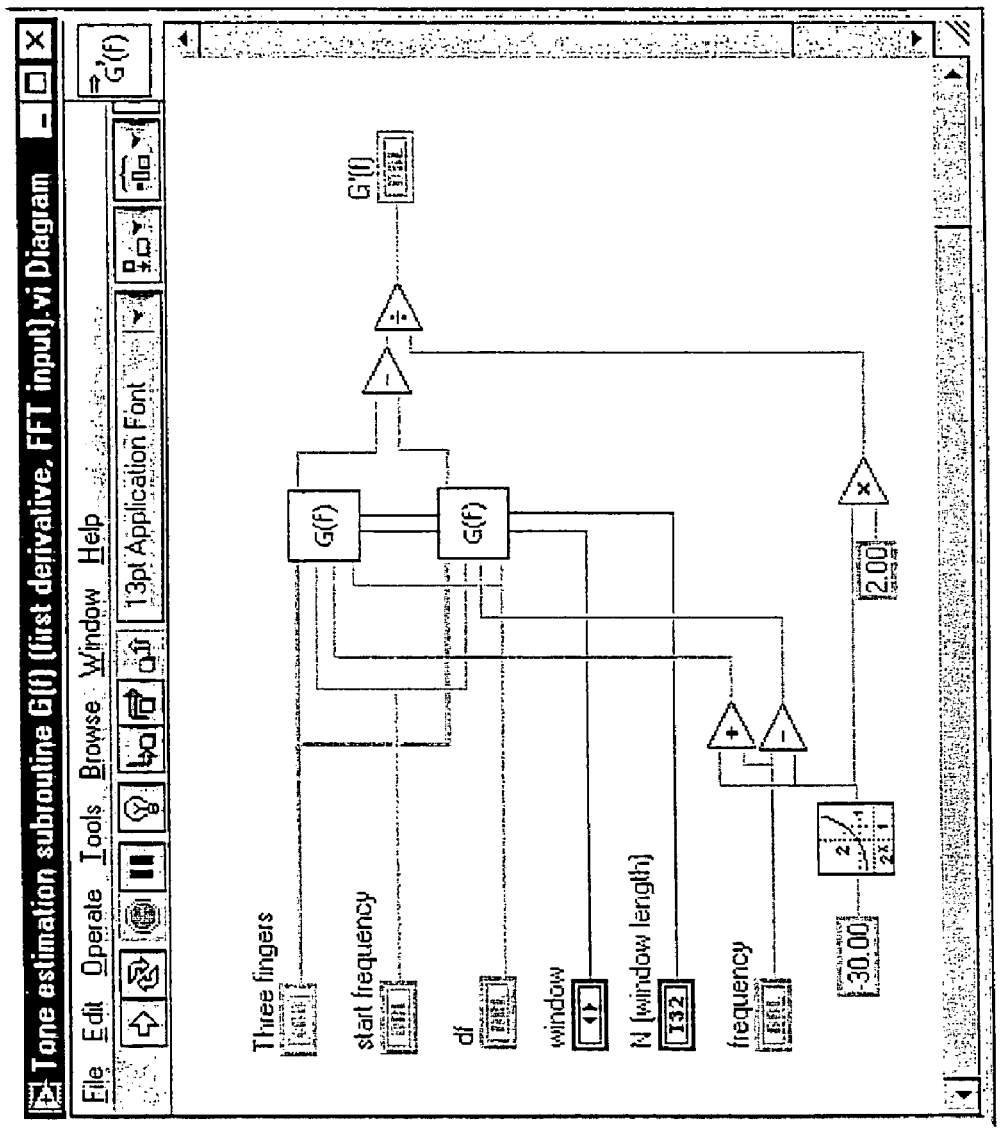

FIGS. 18A and 18B illustrate a front panel and block diagram, respectively, of the graphical program block titled "G'(f)".

Thus, various embodiments of the invention provide means for identifying and estimating signal parameters characterizing multiple tones in a received signal. The systems and methods described herein provide for improved estimation of the signal parameters for each of the multiple tones in the signal by iteratively removing the effects of other tones from each tone and applying a single tone estimation technique to estimate the signal parameters of the tone. The method may iterate over the tones multiple times to increase the accuracy of the tone parameter estimates, producing a set of final signal parameter estimates for each tone.

Although the system and method of the present invention is described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims.

I claim:

1. A method for determining one or more signal parameters for a plurality of tones in an input signal, the method comprising:
   a) receiving samples of the input signal, wherein the input signal includes a plurality of tones;
   b) generating a frequency transform of the samples, wherein the frequency transform comprises frequency response data for the plurality of tones;
   c) determining one or more signal parameter estimates characterizing each of the plurality of tones;
   d) for each respective tone of the plurality of tones, generating modified frequency response data for the respective tone using one or more signal parameter estimates of one or more of the other tones, wherein the modified frequency response data for the respective tone includes reduced effects of other tones of the plurality of tones;
   wherein step d) is performed in an iterative fashion; and
   e) determining final one or more signal parameter estimates for each of the plurality of tones based on the modified frequency response data of the plurality of tones.

2. The method of claim 1, wherein step c) comprises:
   c1) determining a plurality of potential local peaks based on the frequency response data, wherein each potential local peak corresponds to a tone;
   c2) determining one or more signal parameter estimates characterizing each of the plurality of tones based on said plurality of potential local peaks;
   c3) storing said one or more signal parameter estimates for each of the plurality of tones.

3. The method of claim 2, wherein step d) comprises:
   for each respective tone characterized by said one or more signal parameter estimates,
   d1) removing effects of other tones of the plurality of tones from the frequency response data of the potential local peak of the respective tone using said one or more signal parameter estimates of each of said other tones to generate modified frequency response data for the respective tone;
   d2) applying a single tone estimation method to the modified frequency response data, thereby generating a refined estimate of the one or more signal parameters of the respective tone; and
   d3) updating said one or more signal parameter estimates with the refined estimate of the one or more signal parameters of the respective tone;
   wherein, after said removing, said applying, and said updating for each tone, the one or more signal parameter estimates comprise refined estimates for each tone.

4. The method of claim 3, wherein step e) comprises:
   performing steps d1) through d3) one or more times to generate final one or more signal parameter estimates for each of the plurality of tones.

5. The method of claim 4,
wherein said one or more signal parameter estimates characterizing the plurality of tones comprise a knowledge base of said signal parameter estimates;
wherein said storing one or more signal parameter estimates comprises:
storing a copy of said knowledge base, wherein said copy comprises a prior knowledge base; and
wherein said updating said one or more signal parameter estimates with the refined estimate of the one or more signal parameters of the respective tone comprises:
updating said knowledge base with said refined estimate of the one or more signal parameters of the tone, wherein, after said removing, said applying, and said updating for each tone, the knowledge base is comprised of said refined estimates for each tone.

6. The method of claim 5, wherein said performing steps d1) through d3) one or more times comprises performing steps d1) through d3) in an iterative manner until one or more of 1) the number of iterations exceeds a threshold number of iterations, and 2) the difference between values of the one or more signal parameters of said knowledge base and values of the one or more signal parameters of said prior knowledge base is less than a threshold value.

7. The method of claim 4, wherein said one or more signal parameter estimates comprise estimates for one or more of frequency, amplitude, and phase.

8. The method of claim 7, wherein said estimate of frequency comprises the frequency value of the determined potential local peak.

9. The method of claim 7, wherein said estimate of amplitude is zero.

10. The method of claim 7, wherein said estimate of amplitude is the value of the potential local peak.

11. The method of claim 7, wherein said estimate of phase is zero.

12. The method of claim 4, wherein said frequency transform comprises a windowed Fast Fourier Transform (FFT).

13. The method of claim 4, further comprising:
storing the final signal parameter estimates for each of the plurality of tones.

14. The method of claim 4, further comprising:
outputting the final signal parameter estimates for each of the plurality of tones.

15. The method of claim 4, wherein said storing said one or more signal parameter estimates for each of the plurality of tones comprises:
sorting said signal parameter estimates for the plurality of tones by amplitude of said potential local peaks; and
wherein said removing effects, said applying a single tone estimation, and said updating said one or more signal parameter estimates are performed for each of said plurality of tones in order of decreasing amplitude.

16. The method of claim 4, wherein said removing effects of other tones from the frequency response data of the potential local peak of the respective tone comprises:
determining two or more sample values proximate to the potential local peak; and
for each of the other tones,
calculating an effect value for each of the two or more sample values using the estimated signal parameters for the tone; and
subtracting the respective effect values from each of the two or more sample values to generate a corresponding two or more modified sample values, wherein said two or more modified sample values comprise said modified frequency response data;
wherein said modified frequency response data are usable in applying said single tone estimation method.

17. The method of claim 16, wherein said two or more sample values are consecutive sample values.

18. The method of claim 16,
wherein said frequency transform comprises a windowed Fast Fourier Transform (FFT) with window function $W(f)$, wherein $f$ denotes frequency;
wherein said estimated signal parameters for the tone comprise an amplitude $A_1$, a frequency $f_1$, and a phase $\phi_1$, and wherein said calculating an effect value for each of the two or more sample values using the estimated signal parameters for the tone comprises calculating:

$$dF(m)=A_1 e^{-j\phi_1} W(f_m+f_1)+A_1 e^{-j\phi_1} W(f_m-f_1),$$

for each sample m, wherein m denotes an index of the sample, and $f_m$ denotes the frequency bin of the sample; and
wherein subtracting the respective effect value from each of the two or more sample values comprises subtracting a respective value of $dF(m)$ from each of the two or more sample values.

19. The method of claim 4, wherein said single tone estimation method comprises:
identifying a frequency location proximate to an amplitude peak in the frequency transform, wherein the amplitude peak corresponds to the tone;
selecting two or more frequency bins proximate to the frequency location in the frequency transform; and
determining a tone frequency value that minimizes a difference between at least a first expression and a second expression;
wherein the first expression comprises a sum of two or more numerator terms divided by a sum of two or more denominator terms, wherein the first expression includes a tone frequency variable;
wherein each numerator term and each denominator term corresponds to one of the frequency bins; and
wherein the second expression comprises a sum of one or more of the numerator terms divided by a sum of one or more of the denominator terms, wherein the second expression includes the tone frequency variable;
wherein the tone frequency value comprises a frequency of the tone.

20. The method of claim 19,
wherein the tone frequency variable represents a correct tone frequency value of the tone; and
wherein the determined tone frequency value represents an approximation of the correct tone frequency value.

21. The method of claim 20,
wherein the first expression is approximately equivalent to the second expression when the correct tone frequency value is used for the tone frequency variable in the first and second expressions.

22. The method of claim 19,
wherein a ratio of each numerator term and its corresponding denominator term represent an amplitude of the tone at a respective bin.

23. The method of claim 19,
wherein a ratio of each numerator term and its corresponding denominator term represent a complex amplitude of the tone at a respective bin.

24. The method of claim 19,
wherein said determining a tone frequency value comprises:
computing a plurality of differences between the first expression and the second expression for different respective tone frequency values of the tone frequency variable; and
selecting the tone frequency value that produces a smallest difference.

25. The method of claim 24, wherein said computing a plurality of differences comprises performing a Newton-Rhapson root finding method.

26. The method of claim 19,
wherein the first expression and the second expression are each a complex expression.

27. The method of claim 26,
wherein said determining a tone frequency value that minimizes a difference between a first complex expression and a second complex expression comprises determining a tone frequency value that minimizes a difference between an amplitude of the first complex expression and an amplitude of the second complex expression.

28. The method of claim 19, wherein said frequency transform comprises a windowed Fast Fourier Transform (FFT), and wherein the first expression and the second expression have the form:

$$\left| \frac{\sum_{k+1}^{k+M} (F(n)W^*(f_n - f_i) - F^*(n)W(f_n + f_i))}{\sum_{k+1}^{k+M} (|W(f_n - f_i)|^2 - |W(f_n + f_i)|^2)} \right| =$$

$$\left| \frac{\sum_{k+1}^{k+M-1} (F(n)W^*(f_n - f_i) - F^*(n)W(f_n + f_i))}{\sum_{k+1}^{k+M-1} (|W(f_n - f_i)|^2 - |W(f_n + f_i)|^2)} \right|$$

wherein:
F(n) is the nth value of the single sided scaled FFT spectrum; and
W represents a window function, wherein the window function is shifted by a value of the tone frequency variable $f_i$.

29. The method of claim 19, wherein said frequency transform comprises a windowed Fast Fourier Transform (FFT), and wherein said generating a frequency transform of the samples comprises generating a power spectrum of the samples;
wherein the first expression and the second expression have the form:

$$\left| \frac{\sum_{k+1}^{k+M} (|F(n)| \times |W(f_n - f_i)|)}{\sum_{k+1}^{k+M} |W(f_n - f_i)|^2} \right| = \left| \frac{\sum_{k+1}^{k+M-1} (|F(n)| \times |W(f_n - f_i)|)}{\sum_{k+1}^{k+M-1} |W(f_n - f_i)|^2} \right|$$

wherein:
F(n) is the nth value of the single sided scaled FFT spectrum; and
W represents a window function, wherein the window function is shifted by a value of the tone frequency variable $f_i$.

30. The method of claim 19, further comprising:
computing one or more of the amplitude and phase of the tone using the determined tone frequency value.

31. The method of claim 19,
wherein at least one of the two or more frequency bins is on each side of the frequency location.

32. The method of claim 19,
wherein said identifying comprises identifying a frequency location of at least one first magnitude peak in the frequency transform; and
wherein said selecting comprises selecting two or more frequency bins proximate to the at least one first magnitude peak in the frequency transform.

33. The method of claim 4, wherein the frequency transform comprises a frequency transform array for the plurality of tones, and wherein said single tone estimation method comprises:
identifying a frequency location of at least one first magnitude peak in the frequency transform array;
selecting two or more frequency bins in a neighborhood of the at least one first magnitude peak in the frequency transform array; and
determining a tone frequency value that minimizes a difference between a first expression and a second expression;
wherein the first expression comprises a sum of two or more numerator terms divided by a sum of two or more denominator terms, wherein the first expression includes a tone frequency variable that represents a correct tone frequency value of the tone;
wherein each numerator term and each denominator term corresponds to one of the frequency bins; and
wherein the second expression comprises a sum of one or more of the numerator terms divided by a sum of one or more of the denominator terms, wherein the second expression includes a tone frequency variable that represents the correct tone frequency value of the tone;
wherein the determined tone frequency value represents an approximation of the correct tone frequency value.

34. The method of claim 33,
wherein the first expression is approximately equivalent to the second expression when the correct tone frequency value is used for the tone frequency variable in the first and second expressions.

35. The method of claim 33,
wherein a ratio of each numerator term and its corresponding denominator term represent a complex amplitude of the tone at a respective bin.

36. The method of claim 4, wherein said single tone estimation method comprises:
identifying two or more frequency bins proximate to a first magnitude peak in the frequency transform; and
selecting a tone frequency value that makes a plurality of expressions most nearly equal;
wherein each of the plurality of expressions comprises a sum of one or more numerator terms divided by a sum of one or more denominator terms, wherein each of the plurality of expressions includes a tone frequency variable;
wherein each numerator term and each denominator term corresponds to one of the frequency bins; and wherein a ratio of each numerator term and its corresponding denominator term represent a complex amplitude of the tone at a respective bin; and wherein the tone frequency value comprises a frequency value of the tone.

37. The method of claim 36, wherein the tone frequency variable represents a correct tone frequency value of the tone; and wherein the determined tone frequency value represents an approximation of the correct tone frequency value.

38. The method of claim 37, wherein the first expression is approximately equivalent to the second expression when the correct tone frequency value is used for the tone frequency variable in the first and second complex expressions.

39. The method of claim 36, wherein said determining a tone frequency value comprises:

computing a plurality of differences between the first expression and the second expression for different respective tone frequency values of the tone frequency variable; and selecting the tone frequency value that produces a smallest difference.

40. The method of claim 36, wherein a ratio of each numerator term and its corresponding denominator term represent a complex amplitude of the tone at a respective bin.

41. The method of claim 36, wherein said frequency transform comprises a windowed Fast Fourier Transform (FFT), and wherein the first expression and the second expression have the form:

$$\left|\frac{\sum_{k+1}^{k+M}(F(n)W^*(f_n-f_i)-F^*(n)W(f_n+f_i))}{\sum_{k+1}^{k+M}(|W(f_n-f_i)|^2-|W(f_n+f_i)|^2)}\right|=$$

$$\left|\frac{\sum_{k+1}^{k+M-1}(F(n)W^*(f_n-f_i)-F^*(n)W(f_n+f_i))}{\sum_{k+1}^{k+M-1}(|W(f_n-f_i)|^2-|W(f_n+f_i)|^2)}\right|$$

wherein:

F(n) is the nth value of the single sided scaled FFT spectrum; and

W represents a window function, wherein the window function is shifted by a value of the tone frequency variable $f_i$.

42. The method of claim 36, wherein said frequency transform comprises a windowed Fast Fourier Transform (FFT), and wherein said generating a frequency transform of the samples comprises generating a power spectrum of the samples;

wherein the first expression and the second expression have the form:

$$\left|\frac{\sum_{k+1}^{k+M}(|F(n)|\times|W(f_n-f_i)|)}{\sum_{k+1}^{k+M}|W(f_n-f_i)|^2}\right|=\left|\frac{\sum_{k+1}^{k+M-1}(|F(n)|\times|W(f_n-f_i)|)}{\sum_{k+1}^{k+M-1}|W(f_n-f_i)|^2}\right|$$

wherein:

F(n) is the nth value of the single sided scaled FFT spectrum; and

W represents a window function, wherein the window function is shifted by a value of the tone frequency variable $f_i$.

43. The method of claim 36, further comprising:
storing the determined tone frequency value in a memory.

44. The method of claim 36, further comprising:
outputting the determined tone frequency value.

45. The method of claim 36, further comprising:
computing one or more of the amplitude and phase of the tone using the determined tone frequency value.

46. The method of claim 36, wherein the plurality of expressions include:

a first expression comprising a sum of one or more numerator terms divided by a sum of one or more denominator terms; and a second expression comprising a sum of at least two numerator terms divided by a sum of at least two denominator terms.

47. The method of claim 36, wherein the plurality of expressions include:

a first expression comprising a sum of two or more numerator terms divided by a sum of two or more denominator terms; and a second expression comprising a sum of three or more numerator terms divided by a sum of three or more denominator terms.

48. The method of claim 1, further comprising:

determining a plurality of potential local peaks based on the frequency response data for the plurality of tones, wherein each potential local peak corresponds to a tone;

wherein said one or more signal parameter estimates are determined based on the plurality of potential local peaks.

49. The method of claim 1, wherein said generating modified frequency response data for the respective tone comprises generating modified frequency response data of the potential local peak of the respective tone.

50. The method of claim 49, wherein said generating modified frequency response data of the potential local peak comprises:

determining two or more sample values proximate to the potential local peak; and for each of the other tones, calculating an effect value for each of the two or more sample values using the estimated signal parameters for the tone; and subtracting the respective effect values from each of the two or more sample values to generate a corresponding two or more modified sample values, wherein said two or more modified sample values comprise said modified frequency response data.

51. The method of claim 50, wherein said two or more sample values are consecutive sample values.

52. The method of claim 50,
wherein said frequency transform comprises a windowed Fast Fourier Transform (FFT) with window function W(f), wherein f denotes frequency;
wherein said estimated signal parameters for the tone comprise an amplitude $A_1$, a frequency $f_1$, and a phase $\phi_1$, and wherein said calculating an effect value for each of the two or more sample values using the estimated signal parameters for the tone comprises calculating:

$$dF(m) = A_1 e^{-j\phi_1} W(f_m + f_1) + A_1 e^{-j\phi_1} W(f_m - f_1),$$

for each sample m, wherein m denotes an index of the sample, and $f_m$ denotes the frequency bin of the sample; and
wherein subtracting the respective effect value from each of the two or more sample values comprises subtracting a respective value of dF(m) from each of the two or more sample values.

53. The method of claim 1, wherein, in each iteration of said generating modified frequency response data, (d) further comprises:
applying a single tone estimation method to the modified frequency response data, thereby generating a refined estimate of the one or more signal parameters of the respective tone; and
updating said one or more signal parameter estimates with the refined estimate of the one or more signal parameters of the respective tone;
wherein the final one or more signal parameter estimates for each of the plurality of tones are determined based on the refined estimates of the one or more signal parameters of the respective tone.

54. The method of claim 1, further comprising:
for each respective tone of the plurality of tones:
applying a single tone estimation method to the modified frequency response data, thereby generating a refined estimate of the one or more signal parameters of the respective tone; and
updating said one or more signal parameter estimates with the refined estimate of the one or more signal parameters of the respective tone;
wherein said applying and said updating are performed for each of the plurality of tones in an iterative fashion; and
wherein the final one or more signal parameter estimates for each of the plurality of tones are determined based on the refined estimates of the one or more signal parameters of the respective tone.

55. The method of claim 54, wherein said single tone estimation method comprises:
identifying a frequency location proximate to an amplitude peak in the frequency transform, wherein the amplitude peak corresponds to the tone;
selecting two or more frequency bins proximate to the frequency location in the frequency transform; and
determining a tone frequency value that minimizes a difference between at least a first expression and a second expression;
wherein the first expression comprises a sum of two or more numerator terms divided by a sum of two or more denominator terms, wherein the first expression includes a tone frequency variable;
wherein each numerator term and each denominator term corresponds to one of the frequency bins; and
wherein the second expression comprises a sum of one or more of the numerator terms divided by a sum of one or more of the denominator terms, wherein the second expression includes the tone frequency variable; and
wherein the tone frequency value comprises a frequency of the tone.

56. The method of claim 55, wherein said determining a tone frequency value comprises:
computing a plurality of differences between the first expression and the second expression for different respective tone frequency values of the tone frequency variable; and
selecting the tone frequency value that produces a smallest difference;
wherein said computing a plurality of differences comprises performing a Newton-Rhapson root finding method.

57. A memory medium comprising program instructions for determining one or more signal parameters for a plurality of tones in an input signal, wherein the program instructions are executable by one or more processors to implement:
a) receiving samples of the input signal, wherein the input signal includes a plurality of tones;
b) computing a frequency transform of the input signal using said samples, wherein the frequency transform comprises frequency response data for the plurality of tones;
c) determining a plurality of potential local peaks based on the frequency response data, wherein each potential local peak corresponds to a tone;
d) determining one or more signal parameter estimates characterizing each of the plurality of tones based on said plurality of potential local peaks;
e) storing said one or more signal parameter estimates for each of the plurality of tones;
f) for each respective tone characterized by said one or more signal parameter estimates:
f1) removing effects of other tones of the plurality of tones from the frequency response data of the potential local peak of the respective tone using the stored one or more signal parameter estimates of each of said other tones, thereby generating modified frequency response data for the respective tone;
f2) applying a single tone estimation method to the modified frequency response data of the respective tone, thereby generating a refined estimate of the one or more signal parameters of the respective tone; and
f3) updating said one or more signal parameter estimates of the respective tone with said refined estimate;
wherein, after said removing, said applying, and said updating for each tone, the one or more signal parameter estimates comprise refined estimates for each tone; and
g) performing step f) one or more times to generate final one or more signal parameter estimates for each of the plurality of tones.

58. The memory medium of claim 57,
wherein the one or more signal parameter estimates characterizing the plurality of tones comprise a knowledge base of said signal parameter estimates;
wherein said storing one or more signal parameter estimates comprises:
storing a copy of said knowledge base, wherein said copy comprises a prior knowledge base; and
wherein said updating said one or more signal parameter estimates with the refined estimate of the one or more signal parameters of the respective tone comprises:

updating the knowledge base with said refined estimate of the one or more signal parameters of the tone, wherein, after said removing, said applying, and said updating for each tone, the knowledge base is comprised of said refined estimates for each tone.

59. The memory medium of claim 58, wherein said performing step f) one or more times comprises performing step f) in an iterative manner until one or more of 1) the number of iterations exceeds a threshold number of iterations, or 2) the difference between values of the one or more signal parameters of said knowledge base and values of the one or more signal parameters of said prior knowledge base is less than a threshold value.

60. The memory medium of claim 57, wherein said one or more signal parameter estimates comprise estimates for one or more of frequency, amplitude, and phase.

61. The memory medium of claim 60, wherein said estimate of frequency comprises the frequency value of the determined potential local peak.

62. The memory medium of claim 60, wherein said estimate of amplitude is zero.

63. The memory medium of claim 60, wherein said estimate of amplitude is the value of the potential local peak.

64. The memory medium of claim 60, wherein said initial estimate of phase is zero.

65. The memory medium of claim 57, wherein said frequency transform comprises a windowed Fast Fourier Transform (FFT).

66. The memory medium of claim 57, wherein said storing said one or more signal parameter estimates for each of the plurality of tones comprises:
sorting said signal parameter estimates for the plurality of tones by amplitude of said potential local peaks;
wherein said removing effects, said applying a single tone estimation, and said updating said one or more signal parameter estimates are performed for each of said plurality of tones in order of decreasing amplitude of said potential local peaks.

67. The memory medium of claim 57, wherein said removing effects of other tones from the frequency response data of the potential local peak of the respective tone comprises:
determining two or more sample values in a neighborhood of the potential local peak; and
for each of the other tones,
computing an effect value for each of the two or more sample values using the estimated signal parameters for the tone; and
subtracting the respective effect value from each of the two or more sample values to generate a corresponding two or more modified sample values, wherein said two or more modified sample values comprise said modified frequency response data; and
wherein said modified frequency response data are usable in applying said single tone estimation method.

68. The memory medium of claim 67, wherein said two or more sample values are consecutive sample values.

69. The memory medium of claim 67,
wherein said frequency transform comprises a windowed Fast Fourier Transform (FFT) with window function W(f), wherein f denotes frequency;
wherein said estimated signal parameters for the tone comprise an amplitude $A_1$, a frequency $f_1$, and a phase $\phi_1$, and wherein said computing an effect value for each of the two or more sample values using the estimated signal parameters for the tone comprises computing:

$$dF(m) = A_1 e^{-j\phi_1} W(f_m + f_1) + A_1 e^{j\phi_1} W(f_m - f_1),$$

for each sample m, wherein m denotes an index of the sample, and $f_m$ denotes the frequency bin of the sample; and
wherein subtracting the respective effect value from each of the two or more sample values comprises subtracting a respective value of dF(m) from each of the two or more sample values.

70. The memory medium of claim 57, wherein said single tone estimation method comprises:
identifying a frequency location proximate to an amplitude peak in the frequency transform, wherein the amplitude peak corresponds to the tone;
selecting two or more frequency bins proximate to the frequency location in the frequency transform;
determining a tone frequency value that minimizes a difference between at least a first expression and a second expression,
wherein the first expression comprises a sum of two or more numerator terms divided by a sum of two or more denominator terms, wherein the first expression includes a tone frequency variable;
wherein each numerator term and each denominator term corresponds to one of the frequency bins; and
wherein the second expression comprises a sum of one or more of the numerator terms divided by a sum of one or more of the denominator terms, wherein the second expression includes a tone frequency variable which represents a correct tone frequency value of the tone; and
wherein the tone frequency value comprises a frequency of the tone.

71. The memory medium of claim 70,
wherein the tone frequency variable represents a correct tone frequency value of the tone; and
wherein the determined tone frequency value represents an approximation of the correct tone frequency value.

72. The memory medium of claim 70,
wherein a ratio of each numerator term and its corresponding denominator term represent a complex amplitude of the tone at a respective bin.

73. The memory medium of claim 70, wherein the first expression and the second expression have the form:

$$\left| \frac{\sum_{k+1}^{k+M} (F(n)W^*(f_n - f_i) - F^*(n)W(f_n + f_i))}{\sum_{k+1}^{k+M} (|W(f_n - f_i)|^2 - |W(f_n + f_i)|^2)} \right| = \left| \frac{\sum_{k+1}^{k+M-1} (F(n)W^*(f_n - f_i) - F^*(n)W(f_n + f_i))}{\sum_{k+1}^{k+M-1} (|W(f_n - f_i)|^2 - |W(f_n + f_i)|^2)} \right|$$

wherein:
F(n) is the nth value of the single sided scaled FFT spectrum; and
W represents a window function, wherein the window function is shifted by a value of the tone frequency variable $f_i$.

74. The memory medium of claim 70,
wherein said generating a frequency transform of the samples comprises generating a power spectrum of the samples;
wherein the first expression and the second expression have the form:

$$\left|\frac{\sum_{k+1}^{k+M}(|F(n)| \times |W(f_n - f_i)|)}{\sum_{k+1}^{k+M}|W(f_n - f_i)|^2}\right| = \left|\frac{\sum_{k+1}^{k+M-1}(|F(n)| \times |W(f_n - f_i)|)}{\sum_{k+1}^{k+M-1}|W(f_n - f_i)|^2}\right|$$

wherein:
F(n) is the nth value of the single sided scaled FFT spectrum; and
W represents a window function, wherein the window function is shifted by a value of the tone frequency variable $f_i$.

75. The memory medium of claim 57, further comprising:
storing the final signal parameter estimates for each of the plurality of tones.

76. The memory medium of claim 57, further comprising:
outputting the final signal parameter estimates for each of the plurality of tones.

77. The memory medium of claim 57, wherein the frequency transform comprises a frequency transform array for the plurality of tones, and wherein said single tone estimation method comprises:
identifying two or more frequency bins proximate to a first magnitude peak in the frequency transform array;
determining a tone frequency value that minimizes a difference between a first expression and a second expression; and
selecting a tone frequency value that makes a plurality of expressions most nearly equal;
wherein each of the plurality of expressions comprises a sum of one or more numerator terms divided by a sum of one or more denominator terms, wherein each of the plurality of expressions includes a tone frequency variable;
wherein each numerator term and each denominator term corresponds to one of the frequency bins; and
wherein a ratio of each numerator term and its corresponding denominator term represent a complex amplitude of the tone.

78. A tone detection system, comprising:
an input for receiving samples of an input signal, wherein the input signal includes a plurality of tones;
a processor; and
a memory medium coupled to the processor, wherein the memory medium stores a tone detection software program for detecting the plurality of tones present in the input signal;
wherein the processor is operable to execute the tone detection software program to implement:
a) generating a frequency transform of the samples, wherein the frequency transform comprises frequency response data for the plurality of tones;
b) determining a plurality of potential local peaks based on the frequency response data, wherein each potential local peak corresponds to a tone;
c) determining one or more signal parameter estimates characterizing each of the plurality of tones based on said plurality of potential local peaks;
d) storing said one or more signal parameter estimates for each of the plurality of tones;
e) for each respective tone characterized by said one or more signal parameter estimates,
  e1) removing effects of other tones of the plurality of tones from the frequency response data of the potential local peak of the respective tone using said one or more signal parameter estimates of each of said other tones to generate modified frequency response data for the respective tone;
  e2) applying a single tone estimation method to the modified frequency response data, thereby generating a refined estimate of the one or more signal parameters of the respective tone; and
  e3) updating said one or more signal parameter estimates with the refined estimate of the one or more signal parameters of the respective tone;
wherein, after said removing, said applying, and said updating for each tone, the one or more signal parameter estimates comprise refined estimates for each tone; and
f) performing step e) one or more times to generate final one or more signal parameter estimates for each of the plurality of tones.

79. The tone detection system of claim 78, wherein said removing effects of other tones from the frequency response data of the potential local peak of the respective tone comprises:
determining two or more sample values proximate to the potential local peak;
for each of the other tones,
  calculating an effect value for each of the two or more sample values using the estimated signal parameters for the tone; and
  subtracting the respective effect value from each of the two or more sample values to generate a corresponding two or more modified sample values, wherein said two or more modified sample values comprise said modified frequency response data; and
wherein said modified frequency response data are usable in applying said single tone estimation method.

80. The tone detection system of claim 79, wherein said two or more sample values are consecutive sample values.

81. The tone detection system of claim 79,
wherein said frequency transform comprises a windowed Fast Fourier Transform (FFT) with window function W(f), wherein f denotes frequency;
wherein said estimated signal parameters for the tone comprise an amplitude $A_1$, a frequency $f_1$, and a phase $\phi_1$, and wherein said calculating an effect value for each of the two or more sample values using the estimated signal parameters for the tone comprises calculating:

$$dF(m)=A_1 e^{-j\phi_i}W(f_m+f_1)+A_1 e^{-j\phi_i}W(f_m-f_1),$$

for each sample m, wherein m denotes an index of the sample, and $f_m$ denotes the frequency bin of the sample; and
wherein subtracting the respective effect value from each of the two or more sample values comprises subtracting a respective value of dF(m) from each of the two or more sample values.

82. The tone detection system of claim 78, wherein said single tone estimation method comprises:
identifying an amplitude peak in the frequency transform, wherein the amplitude peak corresponds to the tone;
selecting two or more frequency bins in a neighborhood of the amplitude peak in the frequency transform; and determining a tone frequency value that minimizes a difference between at least a first expression and a second expression;

wherein the first expression comprises a sum of two or more numerator terms divided by a sum of two or more denominator terms, wherein the first expression includes a tone frequency variable;

wherein each numerator term and its corresponding denominator term corresponds to one of the frequency bins; and wherein the second expression comprises a sum of one or more of the numerator terms divided by a sum of one or more of the denominator terms, wherein the second expression includes the tone frequency variable; and wherein the first expression is approximately equivalent to the second expression when the correct tone frequency value is used for the tone frequency variable in the first and second expressions; and wherein the tone frequency value comprises a frequency of the tone.

83. The tone detection system of claim 82, wherein the tone frequency variable represents a correct tone frequency value of the tone; and wherein the determined tone frequency value represents an approximation of the correct tone frequency value.

84. The tone detection system of claim 82, wherein a ratio of each numerator term and its corresponding denominator term represent an amplitude of the tone at a respective bin.

85. The tone detection system of claim 82, wherein a ratio of each numerator term and its corresponding denominator term represent a complex amplitude of the tone at a respective bin.

86. A method for determining signal parameters for a plurality of tones in an input signal, the method comprising:

a) receiving samples of the input signal, wherein the input signal includes a plurality of tones;

b) applying a windowed FFT to the signal to generate a frequency transform of the signal, wherein the frequency transform comprises frequency response information;

c) determining a plurality of potential local peaks based on the frequency response information, wherein each potential local peak corresponds to a tone;

d) building a knowledge base of signal parameters characterizing said plurality of tones by determining initial estimates of signal parameters for each of the plurality of tones;

e) storing a copy of said knowledge base of tone parameters, wherein said copy comprises a prior knowledge base;

f) for each respective tone characterized in said knowledge base, f1) removing effects of the others of the plurality of tones from said estimates of the signal parameters using said knowledge base to generate modified frequency response information for the respective tone;

f2) applying a single tone estimation method to the modified frequency response information, thereby generating a refined estimate of the signal parameters of the tone; and f3) updating said knowledge base with said refined estimate of the signal parameters of the tone;

wherein, after said removing, said applying, and said updating for each tone, the knowledge base is comprised of said refined estimates for each tone; and g) performing steps e) through i) in an iterative manner until 1) the number of iterations exceeds a threshold number of iterations, or 2) the difference between values of the signal parameters of said knowledge base and values of the signal parameters of said prior knowledge base is less than a threshold value.

87. A memory medium comprising program instructions for determining one or more signal parameters for a plurality of tones in an input signal, wherein the program instructions are executable by one or more processors to implement:

a) receiving the input signal, wherein the input signal includes a plurality of tones;

b) computing a frequency transform of the input signal, wherein the frequency transform comprises frequency response data for the plurality of tones;

c) determining one or more signal parameter estimates characterizing each of the plurality of tones based on said frequency response data;

d) for each respective tone of the plurality of tones, generating modified frequency response data for the respective tone using the one or more signal parameter estimates of one or more of the other tones, wherein said generating the modified frequency response data for the respective tone removes effects of other tones of the plurality of tones;

wherein step d) is performed in an iterative fashion; and e) determining final one or more signal parameter estimates for each of the plurality of tones based on the modified frequency response data of the plurality of tones.

* * * * *

UNITED STATES PATENT AND TRADEMARK OFFICE
CERTIFICATE OF CORRECTION

PATENT NO.       : 7,124,042 B2                                          Page 1 of 1
APPLICATION NO.  : 10/757835
DATED            : October 17, 2006
INVENTOR(S)      : Yong Rao It is certified that error appears in the above-identified patent and that said Letters Patent is hereby corrected as shown below:

In the Claims:

Column 40 Line 17, please delete "g) performing steps e) through i) in an iterative manner" and substitute -- g) performing steps e) through f) in an iterative manner --.

Signed and Sealed this

Nineteenth Day of December, 2006

JON W. DUDAS
*Director of the United States Patent and Trademark Office*